(12) United States Patent
Tsushima et al.

(10) Patent No.: US 7,276,301 B2
(45) Date of Patent: Oct. 2, 2007

(54) SURFACE-COATED CERMET CUTTING TOOL WITH A HARD COATING LAYER EXHIBITING EXCELLENT CHIPPING RESISTANCE

(75) Inventors: Fumio Tsushima, Naka-gun (JP); Takuya Hayashi, Naka-gun (JP); Takatoshi Oshika, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 245 days.

(21) Appl. No.: 10/999,222

(22) Filed: Nov. 24, 2004

(65) Prior Publication Data

US 2005/0214579 A1    Sep. 29, 2005

(30) Foreign Application Priority Data

| Nov. 25, 2003 | (JP) | ............................. 2003-393793 |
| Dec. 22, 2003 | (JP) | ............................. 2003-424403 |
| Dec. 22, 2003 | (JP) | ............................. 2003-424404 |
| Dec. 22, 2003 | (JP) | ............................. 2003-424405 |
| Mar. 3, 2004 | (JP) | ............................. 2004-058681 |
| Mar. 3, 2004 | (JP) | ............................. 2004-058684 |
| Mar. 3, 2004 | (JP) | ............................. 2004-058685 |
| Jun. 10, 2004 | (JP) | ............................. 2003-172510 |
| Jun. 14, 2004 | (JP) | ............................. 2004-175038 |
| Jun. 16, 2004 | (JP) | ............................. 2004-178074 |
| Jun. 16, 2004 | (JP) | ............................. 2004-178075 |

(51) Int. Cl.
    *B23P 15/28*    (2006.01)
(52) U.S. Cl. .................... 428/699; 31/307; 31/309; 428/216; 428/336; 428/697; 428/698; 428/701; 428/702

(58) Field of Classification Search ................ 428/697, 428/698, 699, 701, 702, 216, 336; 57/301, 57/309
See application file for complete search history.

(56) References Cited

U.S. PATENT DOCUMENTS 4,180,400 A    12/1979    Smith et al.

(Continued)

FOREIGN PATENT DOCUMENTS

EP    0403461    12/1990

(Continued)

OTHER PUBLICATIONS

Patent Abstracts of Japan for JP06-031503 published Feb. 8, 1994.

(Continued)

*Primary Examiner*—Archene Turner
(74) *Attorney, Agent, or Firm*—Darby & Darby

(57) ABSTRACT

A surface-coated cermet cutting tool with a hard-coating layer having excellent chipping resistance. The hard coating layer is formed on a surface of a tool substrate that constitutes the surface-coated cermet cutting tool. The hard coating layer includes (a) as the lower layer, a titanium compound layer having at least one or two of a titanium carbide layer, a titanium nitride layer, a titanium carbonitride layer, a titanium carboxide layer and a titanium oxycarbonitride layer, and (b) as the upper layer, a heat-transformed α-type Al—Zr oxide layer formed by carrying out a heat-transforming treatment in a state that a titanium oxide layer satisfying the composition formula: $TiO_y$, ¥ The heat-transformed α-type Al—Zr oxide layer is chemically deposited on a surface of an Al—Zr oxide layer having a κ-type or θ-type crystal structure and satisfying the composition formula: $(Al_{1-x}Zr_x)_2O_3$ to transform the crystal structure of the Al—Zr oxide layer having the κ-type or θ-type crystal structure into an α-type crystal structure.

4 Claims, 6 Drawing Sheets

U.S. PATENT DOCUMENTS

| | | | |
|---|---|---|---|
| 4,540,596 A * | 9/1985 | Nimmagadda | 427/249.17 |
| 4,701,384 A * | 10/1987 | Sarin et al. | 428/701 |
| 5,310,607 A * | 5/1994 | Schulz et al. | 428/701 |
| 6,426,137 B1 | 7/2002 | Oshika et al. | |
| 6,586,122 B2 * | 7/2003 | Ishikawa et al. | 428/699 |
| 6,660,371 B1 * | 12/2003 | Westphal et al. | 428/697 |
| 6,726,987 B2 * | 4/2004 | Kathrein et al. | 428/336 |
| 6,733,874 B2 | 5/2004 | Ueda et al. | |
| 6,767,627 B2 * | 7/2004 | Morikawa et al. | 428/701 |
| 6,835,446 B2 | 12/2004 | Ueda et al. | |
| 6,855,405 B2 * | 2/2005 | Okada et al. | 428/216 |
| 2004/0224159 A1 | 11/2004 | Oshika et al. | |

FOREIGN PATENT DOCUMENTS

| | | |
|---|---|---|
| EP | 0727510 | 8/1996 |
| EP | 1 247 789 A | 10/2002 |
| EP | 1 288 335 A | 3/2003 |

OTHER PUBLICATIONS

Patent Abstracts of Japan for JP06-008010 published Jan. 18, 1994.

M. Kathrein et al., "Doped CVD Al2O3 coatings for high performance cutting tools", Surface and Coatings Technology, vol. 163, Jan. 1, 2003, pp. 181-188, XP002362564.

A. A. Layyous et al., "Al2O3 coated cemented carbides: optimization structure, number of layers and type of Interlayer", Surface and Coatings Technology, vol. 56, 1992, pp. 89-95, XP002362565.

* cited by examiner

SURFACE-COATED CERMET CUTTING TOOL WITH A HARD COATING LAYER EXHIBITING EXCELLENT CHIPPING RESISTANCE

INCORPORATION BY REFERENCE

The present application claims priority under 35 U.S.C. §119 to Japanese Patent Application Nos. 2003-393793 filed Nov. 25, 2003; 2003-424404 filed Dec. 22, 2003; 2003-424404 filed Dec. 22, 2003; 2003-424405 filed Dec. 22, 2003; 2004-058681 filed Mar. 3, 2004; 2004-058684 filed Mar. 3, 2004; 2004-058685 filed Mar. 3, 2004; 2004-172510 filed Jun. 10, 2004; 2004-178075 filed Jun. 16, 2004; 2004-178074 filed Jun. 16, 2004 and 2004-175038 filed Jun. 14, 2004. The content of the applications are incorporated herein by reference in their entireties.

BACKGROUND OF THE INVENTION

1. Field of the Invention

The present invention relates to a surface-coated cermet cutting tool (hereinafter referred to as a coated cermet tool) of which a hard coating layer exhibits excellent chipping resistance, in particular, during high-speed intermittent cutting of steel, cast iron, etc.

2. Description of the Related Art

Conventionally, a coated cermet tool is known, which is generally formed by coating, on a surface of a substrate (hereinafter, generally referred to as a tool substrate) made of tungsten carbide (hereinafter, referred to as WC)-based cemented carbide or titanium carbonitride (hereinafter, referred to as TiCN)-based cermet, a hard-coating layer composed of the following upper and lower layers (a) and (b):

(a) as the lower layer, a titanium compound layer having at least one or two of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer, all of which are formed by chemical vapor deposition, the titanium compound layer having a total average layer thickness of 3 to 20 μm, and (b) as the upper layer, a deposited α-type aluminum oxide (hereinafter referred to as $Al_2O_3$) layer having an α-type crystal structure deposited by chemical vapor deposition and an average layer thickness of 1 to 15 μm. The coated cermet tool is widely used for, for example, continuous or intermittent cutting of steel or cast iron.

Generally, it is also well known that a titanium compound layer or deposited α-type $Al_2O_3$ layer constituting the hard-coating layer of a coated cermet tool has a granular crystal structure, and further a TiCN layer constituting the titanium compound layer has a lengthwise growth crystal structure formed by carrying out chemical vapor deposition in a moderate temperature range of 700 to 950° C. using as a reaction gas a mixed gas which includes organic carbonitride, for example, $CH_3CN$ in a conventional chemical vapor deposition reactor for increasing the strength of the layer, as disclosed in Japanese Unexamined Patent Application Publications Nos. 6-31503 and 6-8010.

In recent years, the performance of cutting tools has been markedly enhanced, and demands for labor saving and energy saving in cutting work and cost reduction have been increased. Accordingly, the cutting work is more often carried out at a higher speed range. The conventional coated cermet tools generally present no problem when they are used in the continuous cutting or intermittent cutting of steel, cast iron or the like under normal conditions. And, when the conventional cutting tools are used in a high-speed intermittent cutting under the severest cutting condition, i.e., in the high-speed intermittent cutting where mechanical and thermal impacts are repeatedly applied to the cutting edge at very short pitches, a titanium compound layer which is typically the lower layer of a hard-coating layer has high strength and exhibits excellent impact resistance. However, the deposited α-type $Al_2O_3$ layer that constitutes the upper layer of a hard-coating layer, despite its hardness in high temperature and excellent heat resistance, is very brittle against the mechanical and thermal impacts. As a result, chipping (fine crack) easily occurs in the hard-coating layer, consequently shortening the usable life of cermet cutting tools.

SUMMARY OF THE INVENTION

The present invention is made to solve the above problems, and it is therefore an object of the present invention to provide a surface-coated cermet cutting tool with a hard-coating layer having excellent chipping resistance.

Considering the above problems, the inventors have conducted studies for improving the chipping resistance of a deposited α-type $Al_2O_3$ layer that constitutes the upper layer of the hard-coating layer of the coated cermet tools, and have obtained the following results (a) to (c) described below.

(a) On a surface of a tool substrate, the titanium compound layer as a lower layer is formed under normal conditions using a conventional chemical vapor deposition reactor. An Al—Zr oxide layer [hereinafter, referred to as an $(Al, Zr)_2O_3$ layer having a κ-type or θ-type crystal structure and satisfying the composition formula: $(Al_{1-X}Zr_X)_2O_3$ (where value X is 0.003 to 0.05 in an atomic ratio when measured by an electron probe micro-analyzer (EPMA)] is deposited under the same normal conditions.

Next, the surface of the $(Al, Zr)_2O_3$ layer is processed using the chemical vapor deposition reactor under the following conditions:

Composition of a reaction gas: in volume %, $TiCl_4$: 0.2 to 3%, $CO_2$: 0.2 to 10%, Ar: 5 to 50%, and $H_2$: balance, Temperature of reaction atmosphere: 900 to 1020° C., Pressure of reaction atmosphere: 7 to 30 kPa, and Time: 25 to 100 min.

Then, a titanium oxide layer satisfying the composition formula: $TiO_Y$, (wherein value Y is 1.2 to 1.9 in an atomic ratio to Ti when measured by Auger Electron Spectroscopy) and having an average layer thickness 0.05 to 1.5 μm are formed on the surface of the $(Al, Zr)_2O_3$ layer.

In this state, by carrying out a heat-transforming treatment in an atmosphere of Ar gas, preferably, under the following conditions: a pressure of 7 to 50 kPa, a temperature of 1000 to 1200° C., and a holding duration of 10 to 120 minutes, to transform the (Al, Zr)$_2$O$_3$ layer having the κ-type or θ-type crystal structure into the (Al, Zr)$_2$O$_3$ layer having an α-type crystal structure. Then, by the operation of the titanium oxide layer formed on the surface of the (Al, Zr)$_2$O$_3$ layer before the transformation the κ-type or θ-type crystal structure is wholly and simultaneously transformed into the α-type crystal structure and the progress of the heat transformation is markedly promoted. Thus, cracks generated at the time of the transformation become extremely fine and the titanium oxide particulates are uniformly and dispersedly distributed. Further, the high temperature strength of the (Al, Zr)$_2$O$_3$ layer itself is markedly enhanced by the effect of Zr as a constituent element of the (Al, Zr)$_2$O$_3$ layer. As a result, the heat-transformed α-type (Al, Zr)$_2$O$_3$ layer has a uniformed structure in which cracks generated by the transformation process has fine characteristics over the entire length, in addition to high strength, very strong resistance against mechanical and thermal impacts and excellent chipping resistance. Accordingly, in the coated cermet tool having a hard-coating layer composed of the heat-transformed α-type (Al, Zr)$_2$O$_3$ layer as the upper layer and the titanium compound layer (this titanium compound layer does not exhibit any change during heat-transforming treatment under the above-mentioned conditions) as the lower layer, the heat-transformed α-type (Al, Zr)$_2$O$_3$ layer exhibits excellent chipping resistance, even in a high-speed intermittent cutting accompanied with severe mechanical and thermal impacts, while it has the same high temperature hardness and heat resistance as the excellent high temperature hardness and heat resistance inherent to an α-type Al$_2$O$_3$ layer. Thus, with the presence of the titanium compound layer having high strength, the occurrence of chipping in the hard-coating layer is markedly suppressed and an excellent wear resistance is exhibited for a prolonged period of time.

(b) As for the conventional α-type Al$_2$O$_3$ layer and the above heat-transformed α-type (Al, Zr)$_2$O$_3$ layer, when an inclination angle frequency-distribution graph is obtained from the results of radiating electron beam onto crystal grains having a hexagonal crystal lattice in a measuring range of surfaces to be polished using a field-emission-type scanning electron microscope, as shown in schematic explanatory views of FIGS. 1(a) and 1(b), measuring an inclination angle of a normal line of a plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, the conventional deposited α-type Al$_2$O$_3$ layer, as illustrated in FIG. 6, shows an inclination angle frequency-distribution graph on which the distribution of measured inclination angles of the plane (0001) is unbiased in a range of 0 to 45 degrees, whereas the heat-transformed α-type (Al, Zr)$_2$O$_3$ layer, as illustrated in FIG. 2, shows an inclination angle frequency-distribution graph on which a sharp and highest peak appears at a certain position in an inclination angle interval, and the position of the sharp and highest peak appearing in the inclination angle interval on an X-axis of the graph varies depending on the variation of value Y in the composition formula: TiO$_Y$ of the titanium oxide layer.

(c) According to the test results, when value Y in the composition formula: TiO$_Y$ of the titanium oxide layer is set to 1.2 to 1.9 in an atomic ratio as described above, there is obtained an inclination angle frequency-distribution graph on which the sharp and highest peak appears in an inclination angle range of 0 to 10 degrees, and the sum of frequencies in the range of 0 to 10 degrees occupies 45% or more of the total sum of frequencies on the inclination angle frequency-distribution graph. In a coated cermet tool of the present invention deposited using, as the upper layer of the hard coating layer, a heat-transformed α-type (Al, Zr)$_2$O$_3$ layer which shows the resulting inclination angle frequency-distribution graph on which the inclination angle frequency in the range of 0 to 10 degrees occupies 45% or more, and the highest peak appears in the inclination angle interval in the range of 0 to 10 degrees with the presence of the titanium compound layer as the lower layer, the coated cermet tools of the present invention exhibit more excellent wear resistance without causing chipping in the cutting edge, in particular, in the high-speed intermittent cutting, as compared to the conventional cermet tool.

The present invention has been achieved based on the above research results (a) to (c).

According to the present invention, there is provided a surface-coated cermet cutting tool with a hard-coating layer exhibiting excellent chipping resistance, the surface-coated cermet cutting tool being formed by coating, on a surface of a tool substrate made of tungsten-carbide-based cemented carbide or titanium-carbonitride-based cermet, the hard-coating layer composed of the following upper and lower layers (a) and (b):

(a) as the lower layer, a titanium compound layer having at least one or two of a titanium carbide layer, a titanium nitride layer, a titanium carbonitride layer, a titanium carboxide layer and a titanium oxycarbonitride layer, all of which are deposited by chemical vapor deposition, the titanium compound layer having a total average layer thickness of 3 to 20 μm, and (b) as the upper layer, a heat-transformed α-type (Al, Zr)$_2$O$_3$ layer formed by carrying out a heat-transforming treatment in a state that a titanium oxide layer satisfying the composition formula: TiO$_Y$, (where value Y is 1.2 to 1.9 in an atomic ratio to Ti when measured by Auger Electron Spectroscopy) and having an average layer thickness of 0.05 to 1.5 μm is chemically deposited on a surface of an (Al, Zr)$_2$O$_3$ layer having a κ-type or θ-type crystal structure deposited by chemical vapor deposition and satisfying the composition formula: (Al$_{1-X}$Zr$_X$)$_2$O$_3$ (where value X is 0.003 to 0.05 in an atomic ratio when measured by an electron probe micro-analyzer (EPMA)) to thereby transform the crystal structure of the (Al, Zr)$_2$O$_3$ layer having the κ-type or θ-type crystal structure into an α-type crystal structure, the heat-transformed α-type (Al, Zr)$_2$O$_3$ layer showing an inclination angle frequency-distribution graph on which a highest peak appears in an inclination angle interval in a range of 0 to 10 degrees and the sum of frequencies in a range of 0 to 10 degrees occupies 45% or more of the total sum of frequencies on the inclination angle frequency-distribution graph, wherein the inclination angle frequency-distribution graph is obtained from results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and the heat-transformed α-type (Al, Zr)$_2$O$_3$ layer having an average layer thickness of 1 to 15 μm.

The reasons for limiting the numerical values in the layers constituting the hard coating layer of the coated cermet layer of the present invention as described above will be described below.

(a) Average layer thickness of the lower layer (Ti compound layer)

A titanium compound layer inherently has excellent high temperature strength, and the hard-coating layer has high temperature strength by virtue of the existence of the titanium compound layer. In addition, the titanium compound layer is firmly adhered to both of the tool substrate and the heat-transformed α-type (Al, Zr)$_2$O$_3$ layer that is the upper layer. Accordingly, it contributes to improving the adherence of the hard-coating layer to the tool substrate. However, when the total average layer thickness is less than 3 μm, the above function cannot be sufficiently obtained. On the other hand, when the total average layer thickness exceeds 20 μm, thermal plastic deformation is apt to occur, particularly in a high-speed intermittent cutting accompanied by the generation of high heat, which causes partial wear. Accordingly, the average layer thickness of a lower layer is preferably set to 3 to 20 μm.

(b) Composition and average layer thickness of titanium oxide layer (value Y)

As described above, by the operation of the titanium oxide layer a deposited κ-type or θ-type (Al, Zr)$_2$O$_3$ layer is wholly and simultaneously transformed into a heat-transformed α-type (Al, Zr)$_2$O$_3$ layer to thereby make cracks generated at the time of heating transformation fine and uniform. In addition, the titanium oxide layer functions to promote the heating transformation and to suppress the growth of crystal grains by shortening the processing time. Moreover, when value Y in the composition formula: TiO$_Y$ of the titanium oxide layer is set to 1.2 to 1.9 as described above, according to the test results, the titanium oxide layer functions to show an inclination angle frequency-distribution graph on which a highest peak of inclination angle frequency appears in an inclination angle interval range of 0 to 10 degrees, and the ratio of the sum of frequencies in the inclination angle frequency range of 0 to 10 degrees occupies 45% of the total sum of frequencies on the inclination angle frequency-distribution graph. Accordingly, when value Y is less than 1.2, the highest peak appears less in the range of 0 to 10 degrees on the inclination angle frequency-distribution graph of the heat-transformed α-type (Al, Zr)$_2$O$_3$ layer. In other words, the ratio of the sum of frequencies in the range of 0 to 10 degrees may become less than 45% of the total sum of frequencies on the inclination angle frequency-distribution graph. In this case, as described above, a desired excellent high temperature strength cannot be secured in the heat-transformed α-type (Al, Zr)$_2$O$_3$ layer, which leads to the failure in obtaining a desired chipping resistance. On the other hand, when value Y exceeds 1.9, the inclination angle interval in which the highest peak appears may deviates out of the range of 0 to 10 degrees. In this case, the desired high temperature strength cannot be secured in the heat-transformed α-type (Al, Zr)$_2$O$_3$ layer. Thus, value Y is set to 1.2 to 1.9 in an atomic ratio to Ti.

Further, in this case, when the average layer thickness of the titanium oxide layer is less than 0.05 μm, the above-mentioned functions cannot be sufficiently obtained. On the other hand, since the above functions can be sufficiently obtained only with an average layer thickness of 1.5 μm, and the thickness beyond the limit is unnecessary, the average layer thickness of the titanium oxide layer is preferably set to 0.05 to 1.5 μm.

(c) Content ratio of Zr in the upper layer [a heat-transformed α-type (Al, Zr)$_2$O$_3$ layer] and average layer thickness of the upper layer The heat-transformed α-type (Al, Zr)$_2$O$_3$ layer has excellent high temperature hardness and heat resistance by the presence of Al as a constituent element thereof, and has high temperature strength by the presence of Zr as a constituent element thereof. Thus, the heat-transformed α-type (Al, Zr)$_2$O$_3$ layer exhibits excellent wear resistance and chipping resistance. However, when the content ratio (value X) of Zr is less than 0.003 in an atomic ratio occupied in the total amount with Al (this is true of the following ratios), a sufficiently enhanced high temperature strength cannot be secured. On the other hand, when the content ratio of Zr exceeds 0.05, instability is caused in the hexagonal crystal lattice, which makes it difficult to sufficiently transform an κ-type or θ-type crystal structure into an α-type crystal structure during the heat-transforming treatment. Thus, the content ratio (value X) of Zr is preferably set to 0.003 to 0.05.

Further, when the average layer thickness of the heat-transformed α-type (Al, Zr)$_2$O$_3$ layer is less than 1 μm, the hard coating layer cannot be allowed to sufficiently exhibit wear resistance. On the other hand, when the average layer thickness of the heat-transformed α-type (Al, Zr)$_2$O$_3$ layer is greater than 15 μm, chipping is apt to occur. Thus, the average layer thickness of the heat-transformed α-type (Al, Zr)$_2$O$_3$ layer is preferably set to 1.15 μm.

Furthermore, for the purpose of identifying the cutting tool before and after the use thereof, a TiN layer having a gold color tone may be deposited, if desired. In this case, the average layer thickness of the TiN layer is preferably 0.1 to 1 μm. This is because, when the average layer thickness is less than 0.1 μm, a sufficient identification cannot be achieved, whereas the identification due to the TiN layer is sufficient with an average layer thickness of up to 1 μm.

Further, the inventors have obtained the following results (a) to (c) described below.

(a) On a surface of a tool substrate, the titanium compound layer as a lower layer is formed under normal conditions using a conventional chemical vapor deposition reactor. An Al—Cr oxide [hereinafter, referred to as an (Al, Cr)$_2$O$_3$ layer having a κ-type or θ-type crystal structure and satisfying the composition formula: (Al$_{1-X}$Cr$_X$)$_2$O$_3$ (where value X is 0.005 to 0.04 in an atomic ratio when measured by an electron probe micro-analyzer (EPMA)] is deposited under the same normal conditions.

Next, the surface of the (Al, Cr)$_2$O$_3$ layer is processed using the chemical vapor deposition reactor under the following conditions:

Composition of a reaction gas: in volume%, TiCl$_4$: 0.2 to 3%, CO$_2$: 0.2 to 10%, Ar: 5 to 50%, and H$_2$: balance,
Temperature of reaction atmosphere: 900 to 1020° C.,
Pressure of reaction atmosphere: 7 to 30 kPa, and
Time: 25 to 100 min.

Then, a titanium oxide layer satisfying the composition formula: TiO$_Y$, (wherein value Y is 1.2 to 1.9 in an atomic ratio to Ti when measured by Auger Electron Spectroscopy) and having an average layer thickness 0.1 to 2 μm are formed on the surface of the (Al, Cr)$_2$O$_3$ layer.

In this state, by carrying out a heat-transforming treatment in an atmosphere of Ar gas, preferably, under the following conditions: a pressure of 7 to 50 kPa, and a temperature of 1000 to 1200° C., to transform the (Al, Cr)$_2$O$_3$ layer having the κ-type or θ-type crystal structure into the (Al, Cr)$_2$O$_3$ layer having an α-type crystal structure. Then, by the operation of the titanium oxide layer formed on the surface of the (Al, Cr)$_2$O$_3$ layer before the transformation the κ-type or θ-type crystal structure is wholly and simultaneously transformed into the α-type crystal structure and the progress of the heat transformation is markedly promoted. Thus, since cracks generated at the time of the transformation are simultaneously generated, the titanium oxide particulates are extremely finely, uniformly and dispersedly distributed, and the fineness of the cracks generated due to transformation is further promoted by the effect of Cr as a constituent element of the (Al, Cr)$_2$O$_3$ layer. As a result, since the formed heat-transformed α-type (Al, Cr)$_2$O$_3$ layer has a uniformed structure in which cracks generated by transformation process and crystal grains has fine characteristics over the entire layer, it has a very strong resistance against mechanical and thermal impacts and consequently excellent chipping resistance. Accordingly, in the coated cermet tool having a hard-coating layer composed of the heat-transformed α-type (Al, Cr)$_2$O$_3$ layer as the upper layer and the titanium compound layer (this titanium compound layer does not exhibit any change during heat-transforming treatment under the above-mentioned conditions) as the lower layer, the heat-transformed α-type (Al, Cr)$_2$O$_3$ layer exhibits excellent chipping resistance, even in the high-speed intermittent cutting accompanied with severe mechanical and thermal impacts, while it has the same high temperature hardness and heat resistance as the excellent high temperature hardness and heat resistance inherent to an α-type Al$_2$O$_3$ layer. Thus, with the presence of the titanium compound layer having high strength, the occurrence of chipping in the hard-coating layer is markedly suppressed and the excellent wear resistance is exhibited for a prolonged period of time.

(b) As for the conventional α-type Al$_2$O$_3$ layer and the above heat-transformed α-type (Al, Cr)$_2$O$_3$ layer, when an inclination angle frequency-distribution graph is obtained from the results of radiating electron beam onto crystal grains having a hexagonal crystal lattice in a measuring range of surfaces to be polished using a field-emission-type scanning electron microscope, as shown in schematic explanatory views of FIGS. 1(a) and 1(b), measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, the conventional deposited α-type Al$_2$O$_3$ layer, as illustrated in FIG. 6, shows an inclination angle frequency-distribution graph on which the distribution of measured inclination angles of the plane (0001) is unbiased in a range of 0 to 45 degrees, whereas the heat-transformed α-type (Al, Cr)$_2$O$_3$ layer, as illustrated in FIG. 3, shows an inclination angle frequency-distribution graph on which a sharp and highest peak appears at a certain position in an inclination angle interval and the position of the sharp and highest peak appearing in the inclination angle interval on an X-axis of the graph varies depending on the variation of value Y in the composition formula: TiO$_Y$ of the titanium oxide layer.

(c) According to the test results, when value Y in the composition formula: TiO$_Y$ of the titanium oxide layer is set to 1.2 to 1.9 in an atomic ratio to Ti as described above, there is obtained an inclination angle frequency-distribution graph on which the sharp and highest peak appears in an inclination angle range of 0 to 10 degrees, and the sum of frequencies (the sum of frequencies is proportional to the height of the highest peak) in the range of 0 to 10 degrees occupies 45% or more of the total sum of frequencies on the inclination angle frequency-distribution graph. In a coated cermet tool of the present invention deposited using, as the upper layer of the hard coating layer, a heat-transformed α-type (Al, Cr)$_2$O$_3$ layer which shows the resulting inclination angle frequency-distribution graph on which the inclination angle frequency in the range of 0 to 10 degrees occupies 45% or more, and the highest peak appears in the inclination angle interval in the range of 0 to 10 degrees with the presence of the titanium compound layer as a lower layer, the coated cermet tools of the present invention exhibit more excellent wear resistance without causing chipping in a cutting edge, in particular, in the high-speed intermittent cutting, as compared to the conventional cermet tool.

The present invention has been achieved based on the above research results (a) to (c).

According to the present invention, there is provided a surface-coated cermet cutting tool with a hard-coating layer exhibiting excellent chipping resistance, the surface-coated cermet cutting tool being formed by coating, on a surface of a tool substrate made of tungsten carbide-based cemented carbide or titanium carbonitride-based cermet, the hard-coating layer composed of the following upper and lower layers (a) and (b):

(a) as the lower layer, a titanium compound layer having at least one or two of a titanium carbide layer, a titanium nitride layer, a titanium carbonitride layer, a titanium carboxide layer and a titanium oxycarbonitride layer, all of which are deposited by chemical vapor deposition, the titanium compound layer having a total average layer thickness of 3 to 20 μm, and (b) as the upper layer, a heat-transformed α-type (Al, Cr)$_2$O$_3$ layer formed by carrying out a heat-transforming treatment in a state that a titanium oxide layer satisfying the composition formula: TiO$_Y$, (where value Y is 1.2 to 1.9 in an atomic ratio to Ti when measured by Auger Electorn Spectroscopy) and having an average layer thickness of 0.1 to 2 μm is chemically deposited on a surface of an (Al, Cr)$_2$O$_3$ layer having a κ-type or θ-type crystal structure deposited by chemical vapor deposition and satisfying the composition formula: (Al$_{1-X}$Cr$_X$)$_2$O$_3$ (where value X is 0.005 to 0.04 in an atomic ratio when measured by an electron probe micro-analyzer (EPMA)) to thereby transform the crystal structure of the (Al, Cr)$_2$O$_3$ layer having the κ-type or θ-type crystal structure into an α-type crystal structure, the heat-transformed α-type (Al, Cr)$_2$O$_3$ layer showing an inclination angle frequency-distribution graph on which a highest peak appears in an inclination angle interval in a range of 0 to 10 degrees and the sum of frequencies in a range of 0 to 10 degrees occupies 45% or more of the total sum of frequencies on the inclination angle frequency-distribution graph wherein the inclination angle frequency-distribution graph is obtained from the results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and the heat-transformed α-type (Al, Cr)$_2$O$_3$ layer having an average layer thickness of 1 to 15 μm.

The reasons for limiting the numerical values in the layers constituting the hard coating layer of the coated cermet layer of the present invention as described above will be described below.

(a) Average layer thickness of the lower layer (a titanium compound layer)

A titanium compound layer inherently has excellent high temperature strength, and the hard-coating layer has high temperature strength by virtue of the existence of the titanium compound layer. In addition, the titanium compound layer is firmly adhered to both of the tool substrate and the heat-transformed α-type (Al, Cr)$_2$O$_3$ layer that is the upper layer. Accordingly, it contributes to improving the adherence of the hard-coating layer to the tool substrate. However, when the total average layer thickness is less than 3 μm, the above function cannot be sufficiently obtained. On the other hand, when the total average layer thickness exceeds 20 μm, thermal plastic deformation is apt to occur, particularly in the high-speed intermittent cutting accompanied by the generation of high heat, which causes partial wear. Accordingly, the average layer thickness of a lower layer is preferably set to 3 to 20 μm.

(b) Composition and average layer thickness of titanium oxide layer (value Y)

As described above, by the operation of the titanium oxide layer a deposited κ-type or θ-type (Al, Cr)$_2$O$_3$ layer is wholly and simultaneously transformed into a heat-transformed α-type (Al, Cr)$_2$O$_3$ layer to thereby make cracks generated at the time of heating transformation fine and uniform. In addition, the titanium oxide layer functions to promote the heating transformation and to suppress the growth of crystal grains by shortening the processing time. Moreover, when value Y in the composition formula: TiO$_Y$, of the titanium oxide layer is set to 1.2 to 1.9 as described above, according to the test results, the titanium oxide layer functions to show an inclination angle frequency-distribution graph on which a highest peak of inclination angle frequency appears in an inclination angle interval range of 0 to 10 degrees, and the ratio of the sum of frequencies in the inclination angle frequency range of 0 to 10 degrees occupies 45% of the total sum of frequencies on the inclination angle frequency-distribution graph. Accordingly, when value Y is less than 1.2, the highest peak appear less in the range of 0 to 10 degrees on the inclination angle frequency-distribution graph of the heat-transformed α-type (Al, Cr)$_2$O$_3$ layer. In other words, the ratio of the sum of frequencies in the range of 0 to 10 degrees may become less than 45% of the total sum of frequencies on the inclination angle frequency-distribution graph. In this case, as described above, a desired excellent high temperature strength cannot be secured in the heat-transformed α-type (Al, Cr)$_2$O$_3$ layer, which leads to the failure in obtaining a desired chipping resistance. On the other hand, when value Y exceeds 1.9, the inclination angle interval in which the highest peak appears may deviates out of the range of 0 to 10 degrees. In this case, the desired high temperature strength cannot be secured in the heat-transformed α-type (Al, Cr)$_2$O$_3$ layer. Thus, value Y is preferably set to 1.2 to 1.9 in an atomic ratio to Ti.

Further, in this case, when the average layer thickness of the titanium oxide layer is less than 0.1 μm, the above-mentioned functions cannot be sufficiently obtained. On the other hand, since the above functions can be sufficiently obtained only with an average layer thickness of 2 μm, and the thickness beyond the limit is unnecessary, the average layer thickness of the titanium oxide layer is preferably set to 0.1 to 2 μm.

(c) Content ratio and average layer thickness of Cr in the upper layer [heat-transformed α-type (Al, Cr)$_2$O$_3$ layer]

The heat-transformed α-type (Al, Cr)$_2$O$_3$ layer has excellent high temperature hardness and heat resistance by the presence of Al as a constituent element thereof. On the other hand, when Cr as a constituent element coexists with the titanium oxide layer, it functions to still further promote the fineness of fine cracks due to transformation, which is generated at the time of a deposited α-type (Al, Cr)$_2$O$_3$ layer into a heat-transformed α-type (Al, Cr)$_2$O$_3$ layer. However, when the content ratio (value X) of Cr is less than 0.005 in an atomic ratio occupied in the total amount with Al (this is true of the following ratios), an effect to further promote the fineness of cracks due to transformation cannot be secured. On the other hand, when the content ratio of Cr exceeds 0.04, instability is caused in the hexagonal crystal lattice, which makes it difficult to sufficiently perform a κ-type or θ-type crystal structure into an α-type crystal structure during the heat-transforming treatment. Thus, the content ratio (value X) of Cr is set to 0.005 to 0.04, preferably, 0.012 to 0.035.

Further, when the average layer thickness of the heat-transformed α-type (Al, Cr)$_2$O$_3$ layer is less than 1 µm, the hard coating layer cannot be allowed to sufficiently exhibit wear resistance. On the other hand, when the average layer thickness of the heat-transformed α-type (Al, Cr)$_2$O$_3$ layer is greater than 15 µm, chipping is apt to occur. Thus, the average layer thickness of the heat-transformed α-type (Al, Cr)$_2$O$_3$ layer is preferably set to 1 to 15 µm.

Furthermore, for the purpose of identifying the cutting tool before and after the use thereof, a TiN layer having a gold color tone may be deposited, if desired. In this case, the average layer thickness of the TiN layer is preferably 0.1 to 1 µm. This is because, when the average layer thickness is less than 0.1 µm, sufficient identification cannot be achieved, whereas the identification due to the TiN layer is sufficient with an average layer thickness of up to 1 µm.

Further, the inventors have obtained the following results (a) to (c) described below.

(a) On a surface of a tool substrate, the titanium compound layer as a lower layer is formed under normal conditions using a conventional chemical vapor deposition reactor. An Al—Ti oxide layer [hereinafter, referred to as an (Al, Ti)$_2$O$_3$ layer having a κ-type or θ-type crystal structure and satisfying the composition formula: (Al$_{1-X}$Ti$_X$)$_2$O$_3$ (where value X is 0.01 to 0.05 in an atomic ratio when measured by an electron probe micro-analyzer (EPMA)] is deposited under the same normal conditions.

Next, the surface of the (Al, Ti)$_2$O$_3$ layer is processed using the chemical vapor deposition reactor under the following conditions:

Composition of a reaction gas: in volume %, TiCl$_4$: 0.2 to 3%, CO$_2$: 0.2 to 10%, Ar: 5 to 50%, and H$_2$: balance,
Temperature of reaction atmosphere: 900 to 1020° C.,
Pressure of reaction atmosphere: 7 to 30 kPa, and
Time: 25 to 100 min.

Then, a titanium oxide layer satisfying the composition formula: TiO$_Y$, (wherein value Y is 1.2 to 1.9 in an atomic ratio to Ti when measured by Auger Electron Spectroscopy) and having an average layer thickness 0.05 to 1.5 µm are formed on the surface of the (Al, Zr)$_2$O$_3$ layer. In this state, by carrying out a heat-transforming treatment in an atmosphere of Ar gas, preferably, under the following conditions: a pressure of 7 to 50 kPa, a temperature of 1000 to 1200° C., and a holding duration of 10 to 120 minutes, to transform the (Al, Ti)$_2$O$_3$ layer having the κ-type or θ-type crystal structure into the (Al, Ti)$_2$O$_3$ layer having an α-type crystal structure. Then, by the operation of the titanium oxide layer formed on the surface of the (Al, Ti)$_2$O$_3$ layer before the transformation the κ-type or θ-type crystal structure is wholly and simultaneously transformed into the α-type crystal structure and the progress of the heat transformation is markedly promoted. Thus, since cracks generated at the time of the transformation are simultaneously generated, the titanium oxide particulates are extremely finely, uniformly and dispersedly distributed, and the crystal growth at the time of the heat transformation is suppressed by the effect of Ti as a constituent element of the (Al, Ti)$_2$O$_3$ layer and the crystal becomes preferably fine. As a result, since the formed heat-transformed α-type (Al, Ti)$_2$O$_3$ layer has a uniformed structure in which cracks generated by the transformation process and crystal grains become fine over the entire layer, it has a very strong resistance against mechanical and thermal impacts and consequently excellent chipping resistance. Accordingly, in the coated cermet tool having a hard-coating layer composed of the heat-transformed α-type (Al, Ti)$_2$O$_3$ layer as the upper layer and the titanium compound layer (this titanium compound layer does not exhibit any change by heat-transforming treatment under the above-mentioned conditions) as the lower layer, the heat-transformed α-type (Al, Ti)$_2$O$_3$ layer exhibits excellent chipping resistance, even in the high-speed intermittent cutting accompanied with severe mechanical and thermal impacts, while it has the same high temperature hardness and heat resistance as the excellent high temperature hardness and heat resistance inherent to the α-type Al$_2$O$_3$ layer. Thus, with the presence of the titanium compound layer having high strength, the occurrence of chipping in the hard-coating layer is markedly suppressed and the excellent wear resistance is exhibited for a prolonged period of time.

(b) As for the conventional α-type Al$_2$O$_3$ layer and the above heat-transformed α-type (Al, Ti)$_2$O$_3$ layer, when an inclination angle frequency-distribution graph is obtained from the results of radiating electron beam onto crystal grains having a hexagonal crystal lattice in a measuring range of surfaces to be polished using a field-emission-type scanning electron microscope, as shown in schematic explanatory views of FIGS. 1(a) and 1(b), measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, the conventional deposited α-type Al$_2$O$_3$ layer, as illustrated in FIG. 6, shows an inclination angle frequency-distribution graph on which the distribution of measured inclination angles of the plane (0001) is unbiased in a range of 0 to 45 degrees, whereas the heat-transformed α-type (Al, Ti)$_2$O$_3$ layer, as illustrated in FIG. 4, shows an inclination angle frequency-distribution graph on which a sharp and highest peak appears at a certain position in an inclination angle interval and the position of the sharp and highest peak appearing in the inclination angle interval on an X-axis of the graph varies depending on the variation of value Y in the composition formula: TiO$_Y$ of the titanium oxide layer.

(c) According to the test results, when value Y in the composition formula: TiO$_Y$ of the titanium oxide layer is set to 1.2 to 1.9 in an atomic ratio to Ti as described above, there is obtained an inclination angle frequency-distribution graph on which the sharp and highest peak appears in an inclination angle range of 0 to 10 degrees, and the sum of frequencies (the sum of frequencies is proportional to the height of the highest peak) in the range of 0 to 10 degrees occupies 45% or more of the total sum of frequencies on the inclination angle frequency-distribution graph. In a coated cermet tool of the present invention deposited using, as the upper layer of the hard coating layer, a heat-transformed α-type (Al, Ti)$_2$O$_3$ layer which shows the resulting inclination angle frequency-distribution graph on which the inclination angle frequency in the range of 0 to 10 degrees occupies 45% or more, and the highest peak appears in the inclination angle interval in the range of 0 to 10 degrees with the presence of the titanium compound layer as the lower layer, the coated cermet tool of the present invention exhibits more excellent wear resistance without causing chipping in a cutting edge, in particular, in the high-speed intermittent cutting, as compared to the conventional cermet tool.

The present invention has been achieved based on the above research results (a) to (c).

According to the present invention, there is provided a surface-coated cermet cutting tool with a hard-coating layer exhibiting excellent chipping resistance, the surface-coated cermet cutting tool being formed by coating, on a surface of a tool substrate made of tungsten carbide-based cemented carbide or titanium carbonitride-based cermet, the hard-coating layer composed of the following upper and lower layers (a) and (b):

(a) as the lower layer, a titanium compound layer having at least one or two of a titanium carbide layer, a titanium nitride layer, a titanium carbonitride layer, a titanium carboxide layer and a titanium oxycarbonitride layer, all of which are deposited by chemical vapor deposition, and the titanium compound layer having a total average layer thickness of 3 to 20 μm, and (b) as the upper layer, a heat-transformed α-type (Al, Ti)$_2$O$_3$ layer formed by carrying out a heat-transforming treatment in a state that a titanium oxide layer satisfying the composition formula: TiO$_Y$, (where value Y is 1.2 to 1.9 in an atomic ratio to Ti when measured by Auger Electron Spectroscopy) and having an average layer thickness of 0.05 to 1.5 μm is chemically deposited on a surface of an (Al—Ti)$_2$O$_3$ layer having a κ-type or θ-type crystal structure deposited by chemical vapor deposition and satisfying the composition formula: (Al$_{1-x}$Ti$_X$)$_2$O$_3$ (where value X is 0.01 to 0.05 in an atomic ratio when measured by an electron probe micro-analyzer (EPMA)) to thereby transform the crystal structure of the (Al, Ti)$_2$O$_3$ layer having the κ-type or θ-type crystal structure into an α-type crystal structure, the heat-transformed α-type (Al, Ti)$_2$O$_3$ layer showing an inclination angle frequency-distribution graph on which a highest peak appears in an inclination angle interval in a range of 0 to 10 degrees and the sum of frequencies in a range of 0 to 10 degrees occupies 45% or more of the total sum of frequencies on the inclination angle frequency-distribution graph wherein the inclination angle frequency-distribution graph is obtained from results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and the heat-transformed α-type (Al, Ti) oxide layer having an average layer thickness of 1 to 15 μm.

The reason for limiting the numerical values in the layers constituting a hard coating layer of the coated cermet layer of the present invention as described above will be described below.

(a) Average layer thickness of the lower layer (titanium compound layer)

A titanium compound layer inherently has excellent high strength, and the hard-coating layer has high strength by virtue of the existence of the titanium compound layer. In addition, the titanium compound layer is firmly adhered to both of the tool substrate and the heat-transformed α-type (Al, Ti)$_2$O$_3$ layer that is the upper layer. Accordingly, it contributes to improving the adherence of the hard-coating layer to the tool substrate. However, when the total average layer thickness is less than 3 μm, the above function cannot be sufficiently obtained. On the other hand, when the total average layer thickness exceeds 20 μm, thermal plastic deformation is apt to occur, particularly in a high-speed intermittent cutting accompanied by the generation of high heat, which causes partial wear. Accordingly, the total average layer thickness is preferably set to 3 to 20 μm.

(b) Composition and average layer thickness of titanium oxide layer (value Y)

As described above, by the operation of the titanium oxide layer a deposited κ-type or θ-type (Al, Ti)$_2$O$_3$ layer is wholly and simultaneously transformed into a heat-transformed α-type (Al, Ti)$_2$O$_3$ layer to thereby make cracks generated at the time of heating transformation fine and uniform. In addition, the titanium oxide layer functions to promote the heating transformation and to suppress the growth of crystal grains by shortening the processing time. Moreover, when value Y in the composition formula: TiO$_Y$ of the titanium oxide layer is set to 1.2 to 1.9 as described above, according to the test results, the titanium oxide layer functions to show an inclination angle frequency-distribution graph on which a highest peak of inclination angle frequency appears in an inclination angle interval range of 0 to 10 degrees, and the ratio of the sum of frequencies in the inclination angle frequency range of 0 to 10 degrees occupies 45% of the total sum of frequencies on the inclination angle frequency-distribution graph. Accordingly, when value Y is less than 1.2, the highest peak appears less in the range of 0 to 10 degrees on the inclination angle frequency-distribution graph of the heat-transformed α-type (Al, Ti)$_2$O$_3$ layer. In other words, the ratio of the sum of frequencies in the range of 0 to 10 degrees may become less than 45% of the total sum of frequencies on the inclination angle frequency-distribution graph. In this case, as described above, a desired excellent high temperature strength cannot be secured in the heat-transformed α-type (Al, Ti)$_2$O$_3$ layer, which leads to the failure in obtaining a desired chipping resistance. On the other hand, when value Y exceeds 1.9, the inclination angle interval in which the highest peak appears may deviates out of the range of 0 to 10 degrees. In this case, desired excellent high temperature strength cannot be secured in the heat-transformed α-type (Al, Ti)$_2$O$_3$ layer. Thus, value Y is set to 1.2 to 1.9 in an atomic ratio to Ti.

Further, in this case, when the average layer thickness of the titanium oxide layer is less than 0.05 μm, the above-mentioned functions cannot be sufficiently obtained. On the other hand, since the above functions can be sufficiently obtained only with an average layer thickness of 1.5 μm, and the thickness beyond the limit is unnecessary, the average layer thickness of the titanium oxide layer is preferably set to 0.05 to 1.5 μm.

(c) Content ratio of Ti in the upper layer [a heat-transformed α-type (Al, Ti)$_2$O$_3$ layer] and average layer thickness of the upper layer The heat-transformed α-type (Al, Ti)$_2$O$_3$ layer has excellent high temperature hardness and heat resistance by the presence of Al as a constituent element thereof, and has high temperature strength by the presence of Ti as a constituent element thereof. Thus, the heat-transformed α-type (Al, Ti)$_2$O$_3$ layer exhibits excellent wear resistance and chipping resistance. However, when the content ratio (value X) of Ti is less than 0.01 in an atomic ratio (this is true of the following ratios) occupied in the total amount with Al, an effect to make crystal sufficiently fine cannot be exhibited. On the other hand, when the content ratio of Ti exceeds 0.05, instability is caused in the hexagonal crystal lattice, which makes it difficult to sufficiently transform a κ-type or θ-type crystal structure into an α-type crystal structure during the heat-transforming treatment. Thus, the content ratio (value X) of Ti is preferably set to 0.01 to 0.05.

Further, when the average layer thickness of the heat-transformed α-type (Al, Ti)$_2$O$_3$ layer is less than 1 μm, the hard coating layer cannot be allowed to sufficiently exhibit wear resistance. On the other hand, when the average layer thickness of the heat-transformed α-type (Al, Ti)$_2$O$_3$ layer is greater than 15 μm, chipping is apt to occur. Thus, the average layer thickness of the heat-transformed α-type (Al, Ti)$_2$O$_3$ layer is preferably set to 1.15 μm.

Furthermore, for the purpose of identifying the cutting tool before and after the use thereof, a TiN layer having a gold color tone may be deposited, if desired. In this case, the average layer thickness of the TiN layer is preferably 0.1 to 1 μm. This is because, when the average layer thickness is less than 0.1 μm, a sufficient identification cannot be achieved, whereas the identification due to the TiN layer is sufficient with an average layer thickness of up to 1 μm.

Further, the inventors have obtained the following results (a) to (c) described below.

(a) On a surface of a tool substrate, the titanium compound layer as a lower layer is formed under normal conditions using a conventional chemical vapor deposition reactor. An Al$_2$O$_3$ (hereinafter, referred to as a deposited κ, θ-Al$_2$O$_3$) layer having a κ-type or θ-type crystal structure in a state formed by vapor deposition is formed under the same normal conditions.

Next, the surface of the deposited κ, θ-Al$_2$O$_3$ layer is processed using the chemical vapor deposition reactor under the following conditions:

Composition of a reaction gas: in volume %, TiCl$_4$: 0.2 to 3%, CO$_2$: 0.2 to 10%, Ar: 5 to 50%, and H$_2$: balance, Temperature of reaction atmosphere: 800 to 1100° C., Pressure of reaction atmosphere: 4 to 70 kPa, and Time: 15 to 60 min.

Then, a titanium oxide layer satisfying the composition formula: TiO$_X$, (where value X to Ti is 1.2 to 1.9 in an atomic ratio when measured by Auger Electron Spectroscopy) and having an average layer thickness 0.05 to 1 μm are formed on the surface of the Al$_2$O$_3$ layer.

In this state, heat-transforming treatment is carried out in an atmosphere of Ar gas, preferably, under the following conditions: a pressure of 7 to 50 kPa and a temperature of 1000 to 1200° C., to transform the Al$_2$O$_3$ layer having the deposited κ, θ-Al$_2$O$_3$ layer into an Al$_2$O$_3$ layer having an α-type crystal structure. Then, by the operation of the titanium oxide layer formed on the surface of the deposited κ, θ-Al$_2$O$_3$ layer before the transformation the transformation of the κ-type or θ-type crystal structure is wholly and simultaneously transformed into the α-type crystal structure and the progress of the heat transformation is markedly promoted. Thus, since cracks generated at the time of the transformation are simultaneously formed, the titanium oxide particulates are extremely finely, uniformly and dispersedly distributed, and the growth of crystal grains is markedly suppressed by the shortening of the heat-transforming treatment time. As a result, since the formed heat-transformed α-type Al$_2$O$_3$ layer has a uniformed structure in which cracks generated by the transformation and crystal grains becomes fine over the entire layer, it has very strong resistance against mechanical and thermal impacts. Accordingly, in the coated cermet tool having a hard-coating layer composed of the transformed α-Al$_2$O$_3$ layer as the upper layer and the titanium compound layer (this titanium compound layer does not exhibit any change during heat-transforming treatment under the above-mentioned conditions) as the lower layer, the transformed α-Al$_2$O$_3$ layer exhibits excellent chipping resistance with the presence of the titanium compound layer having high strength. Thus, the occurrence of chipping in the hard-coating layer is markedly suppressed and the excellent wear resistance is exhibited for a prolonged period of time.

(b) As for the conventional α-type Al$_2$O$_3$ layer known as the upper layer of a hard coating layer and the transformed α-Al$_2$O$_3$ layer described in (a), when an inclination angle frequency-distribution graph is obtained from results of radiating electron beam onto crystal grains having a hexagonal crystal lattice in a measuring range of surfaces to be polished using a field-emission-type scanning electron microscope, as shown in schematic explanatory views of FIGS. 1(a) and 1(b), measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, the conventional deposited α-Al$_2$O$_3$ layer, as illustrated in FIG. 6, shows an inclination angle frequency-distribution graph on which the distribution of measured inclination angles of the plane (0001) is unbiased in a range of 0 to 45 degrees, whereas the transformed α-Al$_2$O$_3$ layer, as illustrated in FIG. 5, shows an inclination angle frequency-distribution graph on which a sharp and highest peak appears at a certain position in an inclination angle interval and the position of the sharp and highest peak appearing in the inclination angle interval on an X-axis of the graph varies depending on the variation of value X in the composition formula: TiO$_X$ of the titanium oxide layer.

(c) According to the test results, when value X to Ti in the composition formula: TiO$_X$ of the titanium oxide layer is set to 1.2 to 1.9 in an atomic ratio as described above, there is obtained an inclination angle frequency-distribution graph on which the sharp and highest peak appears in an inclination angle range of 0 to 10 degrees, and the sum of frequencies in the range of 0 to 10 degrees occupies 45% or more of the total sum of frequencies on the inclination angle frequency-distribution graph. In a coated cermet tool of the present invention deposited using, as the upper layer of the hard coating layer, a transformed $\alpha$-$Al_2O_3$ layer which shows the resulting inclination angle frequency-distribution graph on which the inclination angle frequency in the range of 0 to 10 degrees occupies 45% or more, and the highest peak appears in the inclination angle interval in the range of 0 to 10 degrees with the presence of the titanium compound layer as the lower layer, the coated cermet tool of the present invention exhibits more excellent wear resistance without causing chipping in a cutting edge, in particular, in the high-speed cutting, as compared to the conventional cermet tool.

The present invention has been achieved based on the above research results.

According to the present invention, there is provided a surface-coated cermet cutting tool with a hard-coating layer exhibiting excellent chipping resistance, the surface-coated cermet cutting tool being formed by coating, on a surface of a tool substrate made of tungsten carbide-based cemented carbide or titanium carbonitride-based cermet, the hard-coating layer composed of the following upper and lower layers (a) and (b):

(a) as the lower layer, a titanium compound layer having at least one or two of a titanium carbide layer, a titanium nitride layer, a titanium carbonitride layer, a titanium carboxide layer and a titanium oxycarbonitride layer, all of which are deposited by chemical vapor deposition, and the titanium compound layer having a total average layer thickness of 3 to 20 µm, and (b) as the upper layer, a transformed $\alpha$-$Al_2O_3$ layer formed by carrying out a heat-transforming treatment in a state that a titanium oxide layer satisfying the composition formula: $TiO_X$, (where value X is 1.2 to 1.9 in an atomic ratio to Ti when measured by Auger Electron Spectroscopy) is chemically deposited on a surface of a deposited $\kappa$, $\theta$-$Al_2O_3$ layer to thereby transform the crystal structure of the deposited $\kappa$, $\theta$-$Al_2O_3$ layer into an $\alpha$-type crystal structure, the transformed $\alpha$-$Al_2O_3$ layer showing an inclination angle frequency-distribution graph on which a highest peak appears in an inclination angle interval in a range of 0 to 10 degrees and the sum of frequencies in a range of 0 to 10 degrees occupies 45% or more of the total sum of frequencies on the inclination angle frequency-distribution graph wherein the inclination angle frequency-distribution graph is obtained from results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and the transformed $\alpha$-$Al_2O_3$ layer having an average layer thickness of 1 to 15 µm.

The reasons for limiting the numerical values in the layers constituting a hard coating layer of the coated cermet layer of the present invention as described above will be described below.

(a) Average layer thickness of a lower layer (Ti compound layer)

A titanium compound layer inherently has excellent high temperature strength, and the hard-coating layer has high temperature strength by virtue of the existence of the titanium compound layer. In addition, the titanium compound layer is firmly adhered to both of the tool substrate and the transformed $\alpha$-type $Al_2O_3$ layer that is the upper layer. Accordingly, it contributes to improving the adherence of the hard-coating layer to the tool substrate. However, when the total average layer thickness is less than 3 µm, the above function cannot be sufficiently obtained. On the other hand, when the total average layer thickness exceeds 20 µm, thermal plastic deformation is apt to occur, particularly in a high-speed intermittent cutting accompanied by the generation of high heat, which causes partial wear. Accordingly, the total average layer thickness is preferably set to 3 to 20 µm.

(b) Composition and average layer thickness of titanium oxide layer (value X)

As described above, by the operation of the titanium oxide layer the heating transformation of a deposited $\kappa$, $\theta$-$Al_2O_3$ layer is wholly and simultaneously transformed into an $\alpha$-$Al_2O_3$ layer to thereby make cracks generated at the time of heating transformation fine and uniform. In addition, the titanium oxide layer has a functions to promote the heating transformation and to suppress the growth of crystal grains by shortening the processing time. Moreover, when value X in the composition formula: $TiO_X$ of the titanium oxide layer is set to 1.2 to 1.9 as described above, according to the test results, the titanium oxide layer functions to show an inclination angle frequency-distribution graph on which a highest peak of inclination angle frequency appears in an inclination angle interval range of 0 to 10 degrees, and the ratio of the sum of frequencies in the inclination angle frequency range of 0 to 10 degrees occupies 45% of the total sum of frequencies on the inclination angle frequency-distribution graph. Accordingly, when value X is less than 1.2, the highest peak appears less in the range of 0 to 10 degrees on the inclination angle frequency-distribution graph of the transformed $\alpha$-$Al_2O_3$ layer. In other words, the ratio of the sum of frequencies in the range of 0 to 10 degrees may become less than 45% of the total sum of frequencies on the inclination angle frequency-distribution graph. In this case, as described above, desired excellent high temperature strength cannot be secured in the transformed $\alpha$-$Al_2O_3$ layer, which leads to the failure in obtaining a desired chipping resistance. On the other hand, when value X exceeds 1.9, the inclination angle interval in which the highest peak appears may deviates out of the range of 0 to 10 degrees. In this case, desired excellent high temperature strength cannot also be secured in the transformed $\alpha$-$Al_2O_3$ layer. Therefore, value X to Ti is preferably set to 1.2 to 1.9 in an atomic ratio.

Further, in this case, when the average layer thickness of the titanium oxide layer is less than 0.05 µm, the above-mentioned functions cannot be sufficiently obtained. On the other hand, since the above functions can be sufficiently obtained only with an average layer thickness of 1 μm, and the thickness beyond the limit is unnecessary, the average layer thickness of the titanium oxide layer is preferably set to 0.05 to 1 μm.

(c) Average layer thickness of an upper layer (a transformed α-$Al_2O_3$ layer)

The transformed α-$Al_2O_3$ layer functions to improve the wear resistance of the hard coating layer by virtue of the high temperature hardness and excellent heat resistance possessed by $Al_2O_3$ itself and to markedly suppress the occurrence of chipping in the hard coating layer even in the high-speed cutting by virtue of its inherent excellent resistance against thermal or mechanical impacts (chipping resistance), as described above. However, when the average layer thickness of the transformed α-$Al_2O_3$ layer is less than 1 μm, the above function cannot be sufficiently obtained. On the other hand, when the average layer thickness of the transformed α-$Al_2O_3$ layer exceeds 15 μm, chipping is apt to occur. Accordingly, the average layer thickness of the transformed α-$Al_2O_3$ layer is preferably set to 1 to 15 μm.

Furthermore, for the purpose of identifying the cutting tool before and after the use thereof, a TiN layer having a gold color tone may be deposited, if desired. In this case, the average layer thickness of the TiN layer is preferably 0.1 to 1 μm. This is because, when the average layer thickness is less than 0.1 μm, a sufficient identification cannot be obtained, whereas the identification due to the TiN layer is sufficient with an average layer thickness of up to 1 μm.

In the coated cermet tool according to the present invention, the heat-transformed α-type (Al, Zr)$_2$O$_3$ layer constituting the upper layer of the hard-coating layer exhibits excellent high temperature hardness and heat resistance, and further excellent chipping resistance even in the high-speed intermittent cutting of steel or cast iron accompanied with very high mechanical and thermal impacts. Thus, the excellent wear resistance is exhibited without causing chipping in the hard coating layer.

In the coated cermet tool according to the present invention, the heat-transformed α-type (Al, Cr)$_2$O$_3$ layer constituting the upper layer of the hard-coating layer exhibits excellent high temperature hardness and heat resistance, and further excellent chipping resistance even in the high-speed intermittent cutting of steel or cast iron accompanied with very high mechanical and thermal impacts. Thus, the excellent wear resistance is exhibited without causing chipping in the hard coating layer.

In the coated cermet tool according to the present invention, the heat-transformed α-type (Al, Ti)$_2$O$_3$ layer constituting the upper layer of the hard-coating layer exhibits excellent high temperature hardness and heat resistance, and further excellent chipping resistance even in the high-speed intermittent cutting of steel or cast iron accompanied with very high mechanical and thermal impacts. Thus, the excellent wear resistance is exhibited without causing chipping in the hard coating layer.

In the coated cermet tool according to the present invention, the transformed α-$Al_2O_3$ layer constituting the upper layer of the hard-coating layer exhibits excellent chipping resistance even in the high-speed intermittent cutting of steel or cast iron accompanied very high mechanical and thermal impacts and high heat generation. Thus, the excellent wear resistance is exhibited for a prolonged period of time.

DETAILED DESCRIPTION OF THE PREFERRED EMBODIMENTS

Figure 1A:
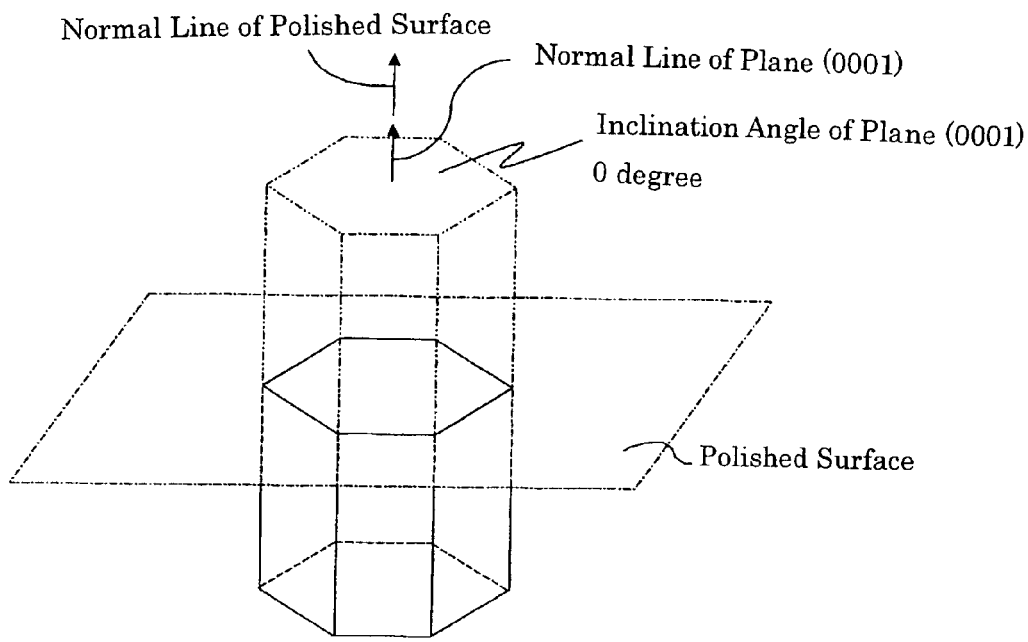
FIG. 1 is a schematic explanatory view illustrating a measuring range of an inclination angle of the plane (0001) of crystal grains in various kinds of a heat-transformed α-type (Al, Zr)$_2$O$_3$ layer, a heat-transformed α-type (Al, Cr)$_2$O$_3$ layer, a heat-transformed α-type (Al, Ti)$_2$O$_3$ layer, a transformed α-$Al_2O_3$ layer and a deposited α-type $Al_2O_3$ layer, which constitute a hard coating layer.
Figure 1B:
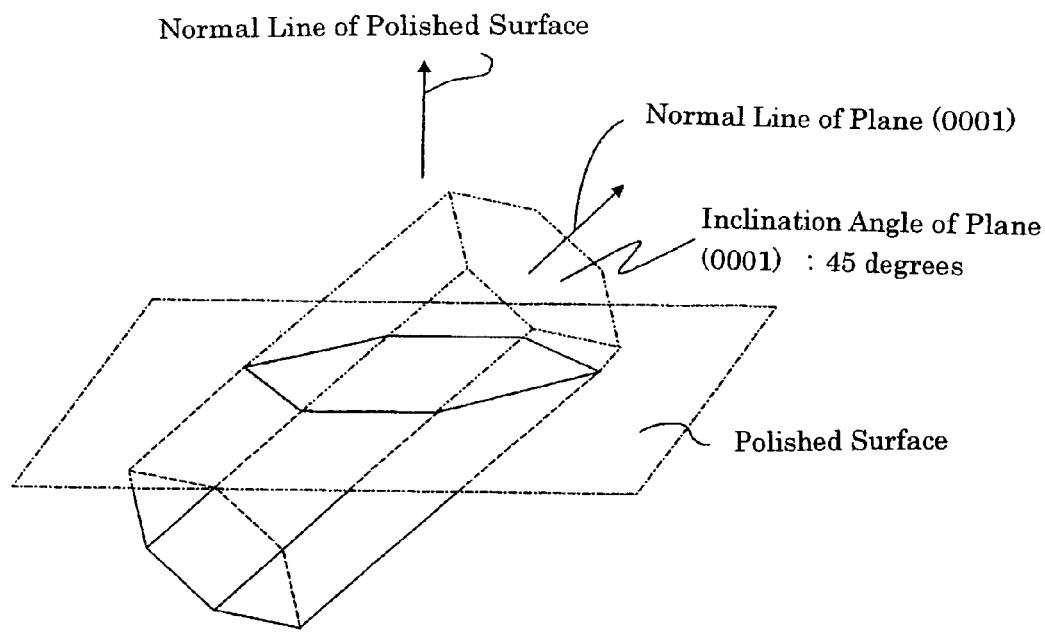

Hereinafter, coated cermet tools according to the present invention will be described in detail by examples with reference to the accompanying drawings.

EXAMPLE 1

The following powders, each having a mean particle size in a range of 1 to 3 μm, were prepared as raw materials for substrates: WC powder, TiC powder, ZrC powder, VC powder, TaC powder, NbC powder, Cr$_3$C$_2$ powder, TiN powder, TaN powder and Co powder. Those raw powders were compounded with each other based on the compounding compositions shown in Table 1, mixed with each other in an acetone solution having wax added thereto for 24 hours using a ball mill and were dried under reduced pressure. Thereafter, the resulting powder mixtures were press-formed into green compacts having predetermined shape at a pressure of 98 Mpa. The green compacts were then sintered in a vacuum under the following conditions: a pressure of 5 Pa, a predetermined temperature in a range of 1370 to 1470° C., and a holding duration of 1 hour. After sintering, cutting edges were subjected to horning (R: 0.07 mm) to manufacture tool substrates A to F made of WC-based cemented carbide and having throwaway tip shapes defined in ISO•CNMG120408.

Further, the following powders, each having a mean particle size in a range of 0.5 to 2 μm, were prepared as raw materials for substrates: TiCN (TiC/TiN=50/50 in weight ratio) powder, $Mo_2C$ power, ZrC power, NbC powder, TaC powder, WC power, Co powder and Ni powder. Those raw powders were compounded with each other based on the compounding composition shown in Table 2, wet-mixed with each other for 24 hours using a ball mill and were dried. Thereafter, the resulting powder mixtures were press-formed into green compacts at a pressure of 98 MPa. The green compacts were then sintered in a nitrogen atmosphere under the following conditions: a pressure of 1.3 kPa, a temperature of 1540° C., and a holding duration of 1 hour. After sintering, cutting edges were subjected to horning (R:0.07 mm) to manufacture tool substrates a to f made of TiCN-based cermet and having tip shapes defined in ISO Standard•CNMG120412.

Next, by using a general chemical vapor deposition reactor, on the surfaces of the tool substrates A to F and a to f, titanium compound layers as lower layers of the hard-coating layers were deposited with combinations and target layer thickness shown in Table 5 under conditions shown in Table 3 (in Table 3, l-TiCN represents formation conditions of TiCN layers having a lengthwise growth crystal structure described in Japanese Unexamined Patent Application Publication No. 6-8010, and the others represent formation conditions of general granular crystal structure). Next, similarly, (Al, $Zr)_2O_3$ layers having a κ-type or θ-type crystal structure were deposited with combinations and target layer thickness shown in Table 5 under conditions shown in Table 3. Subsequently, on a surface of each of the (Al, $Zr)_2O_3$ layers having κ-type or θ-type crystal structure, a titanium oxide layer was deposited with a combination shown in Table 5 under conditions shown in Table 4. In this state, heat-transforming treatment was performed in an Ar atmosphere under the following conditions: a pressure of 30 kPa, a temperature of 1100° C., and a predetermined holding duration in a range of 20 to 100 minutes to transform the (Al, $Zr)_2O_3$ layers having a κ-type or θ-type crystal structure into (Al, $Zr)_2O_3$ layers having an α-type crystal structure. As a result, coated cermet tools 1 to 13 of the present invention having the heat-transformed α-type (Al, $Zr)_2O_3$ layers as upper layers of the hard-coating layers were manufactured, respectively.

Furthermore, in manufacturing the coated cermet tools 1 to 13 of the present invention, separate test pieces are prepared, and those test pieces were loaded into the same chemical vapor deposition reactor. The test pieces were taken out of the chemical vapor deposition reactor at the time when the titanium oxide layers are formed on the surfaces of the test pieces, and compositions (value Y) and layer thickness of the titanium oxide layers were measured (the longitudinal sections of the layers were measured) using Auger Electron Spectroscopy or a scanning electron microscope. As a result, all the coated cermet tools showed substantially the same compositions and average layer thickness (the average value of values measured at five points) as the target compositions and target layer thickness.

For the purpose of comparison, as shown in Table 6, the deposited α-type $Al_2O_3$ layers as upper layers of the hard-coating layers with target layer thickness shown in Table 6 were formed under the same conditions as those shown in Table 3. Then, the conventional cermet tools 1 to 13 were manufactured under the same conditions as the above ones except that the formation of the titanium oxide layers and the heat-transforming treatment under the conditions mentioned above were not performed.

Next, an inclination angle frequency-distribution graph of the heat-transformed α-type (Al, $Zr)_2O_3$ layers and the deposited α-type $Al_2O_3$ layers that constitute the hard-coating layers of the coated cermet tools of the present invention and conventional cermet tools was drawn up using a field-emission-type scanning electron microscope.

Specifically, the inclination angle frequency-distribution graphs were drawn up through the following steps. First, the test pieces are set in a lens-barrel of a field-emission-type scanning electron microscope, using the surfaces of the heat-transformed α-type (Al, $Zr)_2O_3$ layers and deposited α-type $Al_2O_3$ layers thereof as surfaces to be polished. Then, electron beam having an acceleration voltage of 15 kV are individually radiated on crystal grains having the hexagonal crystal lattice in a measuring range of the polished surfaces with an irradiating current of 1 nA at an incidence angle of 70 degrees with respect to the polished surfaces. Next, an inclination angle of a normal line of the plane (0001) as a crystal plane in which each of the crystal grains is formed with respect to a normal line of each of the polished surface was measured at an interval of 0.1 μm/step for an area of 30×50 μm, using an electron backscattering diffraction image device. Based on these measurement results, among all the measured inclination angles, the measured inclination angles in a range of 0 to 45 degrees are sorted into several intervals at a pitch of 0.25 degrees, and the frequencies in each sorted interval are summed up.

In the resulting inclination angle frequency-distribution graphs of the various heat-transformed α-type (Al, $Zr)_2O_3$ layers and deposited α-type $Al_2O_3$ layers, an inclination angle interval in which the plane (0001) shows the highest peak, and the ratio occupied by the inclination angle frequencies in an inclination angle interval ranging from 0 to 10 degrees to all the inclination angle frequencies on the inclination angle frequency-distribution graph is shown in Tables 5 and 6, respectively.

In the above various inclination angle frequency-distribution graphs, as shown in Tables 5 and 6, respectively, all the heat-transformed α-type (Al, $Zr)_2O_3$ layers of the coated cermet tool of the present invention show an inclination angle frequency-distribution graph on which the measured inclination angle distribution of the plane (0001) shows the highest peak in the inclination angle interval in a range of 0 to 10 degrees and on which the ratio of the inclination angle frequencies in the inclination angle interval ranging from 0 to 10 degrees is 45% or more. To the contrary, all the deposited α-type $Al_2O_3$ layers of the conventional coated cermet tools 1 to 13 show an inclination angle frequency-distribution graph on which the distribution of measured inclination angles of the plane (0001) is unbiased in a range of 0 to 45 degrees, the highest peak does not appear, and the ratio of the inclination angle frequencies in the inclination angle interval ranging from 0 to 10 degrees is 23% or less.

Figure 2:
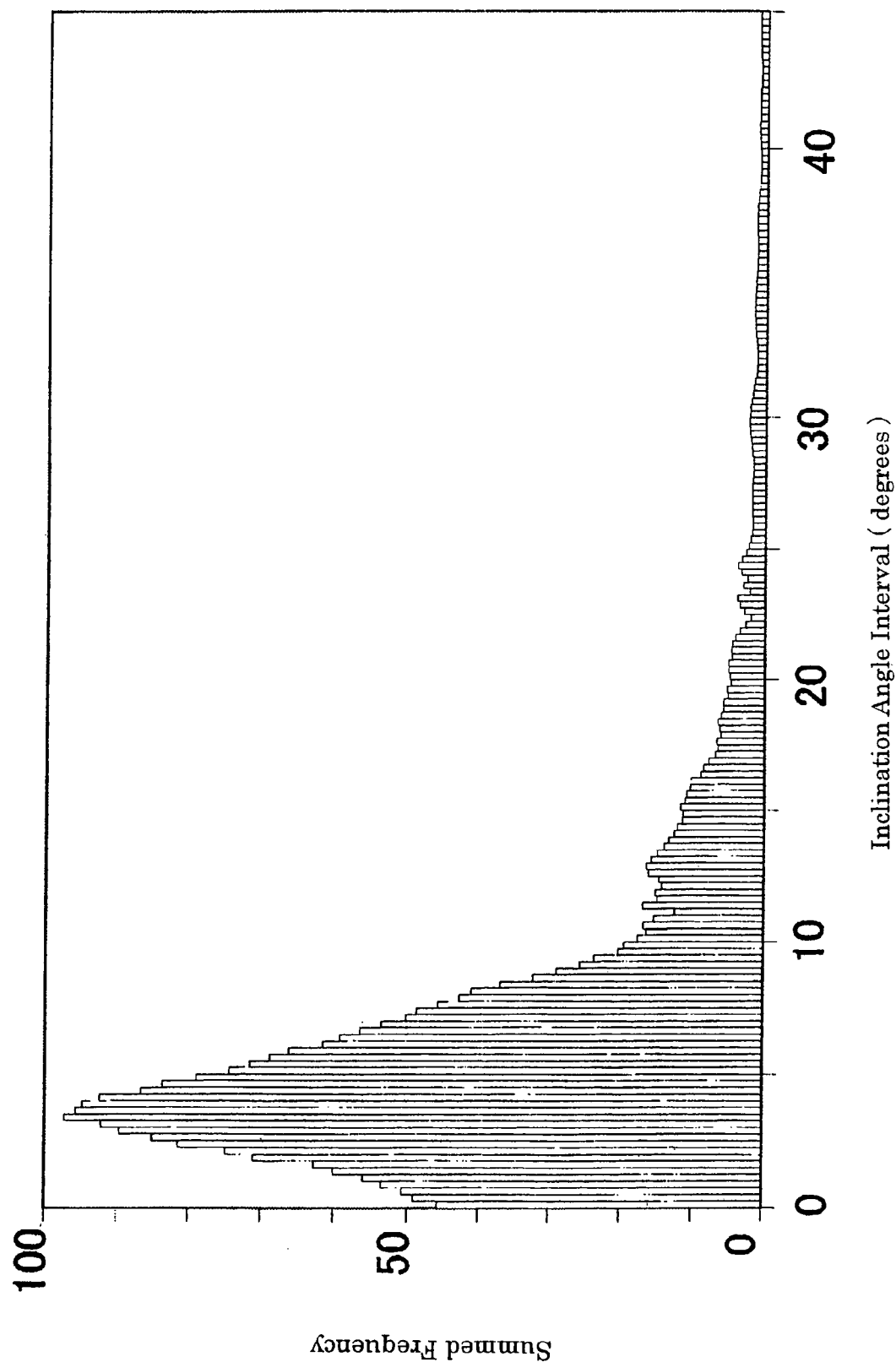
FIG. 2 is an inclination angle frequency-distribution graph of the plane (0001) of a heat-transformed α-type (Al, Zr)$_2$O$_3$ layer which constitutes a hard coating layer of a coated cermet tool 2 of the present invention as shown in Table 5.
Figure 6:
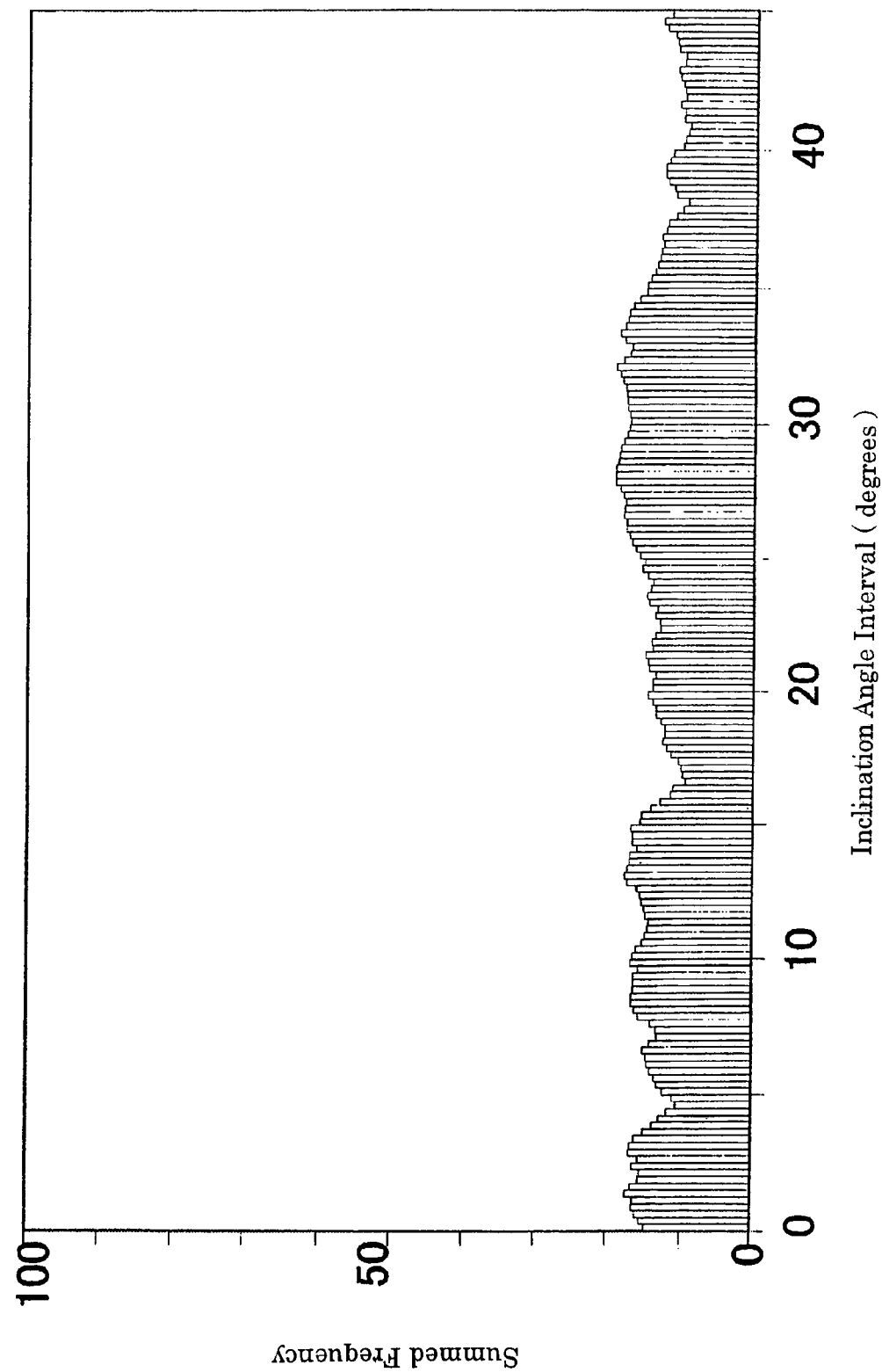
FIG. 6 is an inclination angle distribution graph of the plane (0001) of a deposited α-type $Al_2O_3$ layer which constitutes a hard coating layer of a conventional coated cermet tool.

In addition, FIG. 2 illustrates an inclination angle frequency-distribution graph of the heat-transformed α-type $(Al, Zr)_2O_3$ layer of the coated cermet tool 2 of the present invention, and FIG. 6 illustrates an angle frequency-distribution graph of the deposited α-type $Al_2O_3$ layer of the conventional coated cermet tool 10.

Moreover, as for the coated cermet tools 1 to 13 of the present invention and the conventional coated cermet tools 1 to 13, when the layers that constitute the hard coating layers of the coated cermet tools are observed using an electron probe micro-analyzer (EPMA) or the Auger Electron Spectroscopy (when the longitudinal sections of the layers are observed), it was found that all the coated cermet tools 1 to 13 of the present invention are composed of a Ti compound layer and a heat-transformed α-type $(Al, Zr)_2O_3$ layer, which have substantially the same compositions as the target compositions, and the Ti compound layer deposited before heat-transforming treatment also exists in the surfaces of the tools. On the other hand, it was found that all the conventional cermet tools 1 to 13 are composed of a Ti compound layer and a deposited α-type $Al_2O_3$ layer, which have substantially the same compositions as the target compositions. Further, when the thickness of layers constituting the hard-coating layers of the coated cermet tools was measured by using a scanning electron microscope (similarly, the longitudinal sections of the layers were measured), all the coated cermet tools had substantially the same average layer thickness (the average value of values measured at five points) as the target layer thickness.

Next, in a state in which each of the above-mentioned various coated cermet tools was screw-fixed to a tip of a bite made of tool steel with a fixing jig, the coated cermet tools 1 to 13 of the present invention and the conventional coated cermet tools 1 to 13 were subjected to the following tests:

(1) a dry high-speed intermittent cutting test of alloyed steel (normal cutting speed is 200 m/min) under the following conditions:

Workpiece: a JIS•SCM 420 round bar having four longitudinal grooves equidistantly arranged in the longitudinal direction, Cutting speed: 450 m/min,
Depth of cut: 1.5 mm,
Feed rate: 0.3 mm/rev,
Cutting time: 5 min, (2) a dry high-speed intermittent cutting test of carbon steel (normal cutting speed is 250 m/min) under the following conditions:

Workpiece: a JIS•S25C round bar having four longitudinal grooves equidistantly arranged in the longitudinal direction, Cutting speed: 450 m/min,
Depth of cut: 1.5 mm,
Feed rate: 0.35 mm/rev,
Cutting time: 5 min, (3) a dry high-speed intermittent cutting test of cast iron (normal cutting speed is 250 m/min) under the following conditions:

Workpiece: a JIS•FC250 round bar having four longitudinal grooves equidistantly arranged in the longitudinal direction, Cutting speed: 500 m/min,
Depth of cut: 1.5 mm,
Feed rate: 0.3 mm/rev,
Cutting time: 5 min, Then, the width of flank wear of a cutting edge was measured in each test. The measurement results are shown in Table 7.

TABLE 1

| Type | | Compounding Composition (mass %) | | | | | | | | |
|------|---|----|-----|----|-----|-----|--------|-----|-----|-----|
| | | Co | TiC | ZrC | VC | TaC | NbC | $Cr_3C_2$ | TiN | TaN | WC |
| Tool | A | 7 | — | — | — | — | — | — | — | — | Balance |
| Substrate | B | 5.7 | — | — | — | 1.5 | 0.5 | — | — | — | Balance |
| | C | 5.7 | — | — | — | — | — | 1 | — | — | Balance |
| | D | 8.5 | — | 0.5 | — | — | — | 0.5 | — | — | Balance |
| | E | 12.5 | 2 | — | — | — | — | — | 1 | 2 | Balance |
| | F | 14 | — | — | 0.2 | — | — | 0.8 | — | — | Balance |

TABLE 2

| Type | | Compounding Composition (mass %) | | | | | | | |
|------|---|----|----|-----|-----|-----|---------|----|------|
| | | Co | Ni | ZrC | TaC | NbC | $Mo_2C$ | WC | TiCN |
| Tool | a | 13 | 5 | — | 10 | — | 10 | 16 | Balance |
| Substrate | b | 8 | 7 | — | 5 | — | 7.5 | — | Balance |
| | c | 5 | — | — | — | — | 6 | 10 | Balance |
| | d | 10 | 5 | — | 11 | 2 | — | — | Balance |
| | e | 9 | 4 | 1 | 8 | — | 10 | 10 | Balance |
| | f | 12 | 5.5 | — | 10 | — | 9.5 | 14.5 | Balance |

TABLE 3

| Layer Constituting Hard Coating Layer | | Formation Condition (kPa denotes pressure of reaction atmosphere, and °C. denotes temperature thereof) | | |
|---|---|---|---|---|
| Type | Target Composition (atomic ratio) | Reaction Gas Composition (volume %) | Reaction Atmosphere Pressure | Reaction Atmosphere Temperature |
| TiC | TiC | $TiCl_4$: 4.2%, $CH_4$: 8.5%, $H_2$: Balance | 7 | 1020 |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| Deposited α-type $Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| Deposited κ-type MO: A | Zr (Value X): 0.003 | $AlCl_3$: 3.7%, $ZrCl_4$: 0.03%, $CO_2$: 5.5%, HCl: 2.2%, $H_2S$: 0.2%, $H_2$: Balance | 7 | 950 |
| Deposited θ-type MO: B | Zr (Value X): 0.01 | $AlCl_3$: 3.6%, $ZrCl_4$: 0.1%, $CO_2$: 5.5%, HCl: 2.2%, $H_2S$: 0.2%, $H_2$: Balance | 7 | 800 |
| Deposited κ-type MO: C | Zr (Value X): 0.017 | $AlCl_3$: 3.53%, $ZrCl_4$: 0.17%, $CO_2$: 5.5%, HCl: 2.2%, $H_2S$: 0.2%, $H_2$: Balance | 7 | 950 |
| Deposited θ-type MO: D | Zr (Value X): 0.024 | $AlCl_3$: 3.46%, $ZrCl_4$: 0.24%, $CO_2$: 5.5%, HCl: 2.2%, $H_2S$: 0.2%, $H_2$: Balance | 7 | 800 |
| Deposited κ-type MO: E | Zr (Value X): 0.03 | $AlCl_3$: 3.4%, $ZrCl_4$: 0.3%, $CO_2$: 5.5%, HCl: 2.2%, $H_2S$: 0.2%, $H_2$: Balance | 7 | 950 |
| Deposited θ-type MO: F | Zr (Value X): 0.037 | $AlCl_3$: 3.33%, $ZrCl_4$: 0.37%, $CO_2$: 5.5%, HCl: 2.2%, $H_2S$: 0.2%, $H_2$: Balance | 7 | 800 |
| Deposited κ-type MO: G | Zr (Value X): 0.043 | $AlCl_3$: 3.27%, $ZrCl_4$: 0.43%, $CO_2$: 5.5%, HCl: 2.2%, $H_2S$: 0.2%, $H_2$: Balance | 7 | 950 |
| Deposited θ-type MO: H | Zr (Value X): 0.05 | $AlCl_3$: 3.2%, $ZrCl_4$: 0.5%, $CO_2$: 5.5%, HCl: 2.2%, $H_2S$: 0.2%, $H_2$: Balance | 7 | 800 |

(In Table 3, MO denotes $(Al, Zr)_2O_3$.)

TABLE 4

| Thin Ti Oxide Layer | | | | |
|---|---|---|---|---|
| Type | Target Composition (atomic ratio) | Formation Condition Reaction Gas Composition (volume %) | Reaction Atmosphere Pressure (kPa) | Reaction Atmosphere Temperature (°C.) |
| 1 | $TiO_{1.20}$ | $TiCl_4$: 0.5%, $CO_2$: 0.2%, Ar: 40%, $H_2$: Balance | 30 | 1020 |
| 2 | $TiO_{1.35}$ | $TiCl_4$: 3%, $CO_2$: 5%, Ar: 40%, $H_2$: Balance | 7 | 1000 |
| 3 | $TiO_{1.50}$ | $TiCl_4$: 3%, $CO_2$: 10%, Ar: 50%, $H_2$: Balance | 14 | 1000 |
| 4 | $TiO_{1.60}$ | $TiCl_4$: 1%, $CO_2$: 4.5%, Ar: 40%, $H_2$: Balance | 7 | 1000 |
| 5 | $TiO_{1.75}$ | $TiCl_4$: 1%, $CO_2$: 8%, Ar: 10%, $H_2$: Balance | 7 | 950 |
| 6 | $TiO_{1.90}$ | $TiCl_4$: 0.2%, $CO_2$: 5%, Ar: 5%, $H_2$: Balance | 7 | 900 |

TABLE 5

| Type | Tool | Substrate Symbol | Hard Coating Layer (numeral in parentheses denotes target layer thickness: μm) | | | | | Ti Oxide Layer Target Layer Symbol | Thickness (μm) | Heat-Transformed α-type MO Layer Inclination Angle Interval (degrees) | Frequency Ratio (%) |
|---|---|---|---|---|---|---|---|---|---|---|---|
| | | | First Layer | Second Layer | Third Layer | Fourth Layer | Fifth Layer | | | | |
| Coated Cermet Tool of Present Invention | 1 | A | TiN (1) | l-TiCN (17.5) | TiN (1) | TiCNO (0.5) | Deposited θ-type MO: D (13) | IV | 0.5 | 6.25-6.50 | 69 |
| | 2 | B | TiCN (1) | l-TiCN (8.5) | TiCO (0.5) | Deposited κ-type MO: F (5) | — | II | 1 | 3.25-3.50 | 79 |
| | 3 | C | TiN (1) | l-TiCN (4) | TiC (4) | TiCNO (1) | Deposited κ-type MO: H (15) | V | 0.05 | 0.00-0.25 | 75 |
| | 4 | D | TiC (1) | l-TiCN (9) | Deposited θ-type MO: G (1) | — | — | II | 0.1 | 9.75-10.00 | 45 |
| | 5 | E | TiN (1) | l-TiCN (4.5) | TiCO (0.5) | Deposited κ-type MO: A (5) | — | I | 0.5 | 2.00-2.25 | 85 |
| | 6 | F | TiN (0.5) | l-TiCN (1.5) | TiC (0.5) | TiCNO (0.5) | Deposited κ-type MO: B (3) | III | 1.5 | 1.75-2.00 | 88 |
| | 7 | A | TiN (1) | l-TiCN (8) | TiCNO (0.5) | Deposited κ-type MO: C (8) | — | III | 0.5 | 2.50-2.75 | 90 |
| | 8 | a | TiN (1) | TiCN (19) | Deposited κ-type MO: E (10) | — | — | IV | 1 | 0.75-1.00 | 76 |
| | 9 | b | TiC (0.5) | l-TiCN (9) | TiCO (0.5) | Deposited θ-type MO: H (4) | — | VI | 0.05 | 8.25-8.50 | 51 |
| | 10 | c | TiN (1) | TiC (1) | TiCN (7) | TiCO (1) | Deposited θ-type MO: F (15) | III | 1.5 | 7.00-7.25 | 68 |
| | 11 | d | TiN (1) | TiC (1) | l-TiCN (8) | Deposited κ-type MO: E (7) | — | V | 0.1 | 4.00-4.25 | 82 |
| | 12 | e | TiC (1) | l-TiCN (4) | TiCNO (1) | Deposited θ-type MO: C (12) | — | VI | 0.3 | 7.25-7.50 | 66 |
| | 13 | f | TiCN (0.5) | TiC (2) | TiCNO (0.5) | Deposited θ-type MO: A (1) | — | I | 0.5 | 9.50-9.75 | 48 |

[In Table 5, MO denotes (Al, Zr)$_2$O$_3$; Inclination Angle Interval represents an inclination angle interval in which the plane (0001) shows the highest peak; Frequency Ratio represents a frequency ratio in an inclination angle interval of 0 to 10 degrees]

TABLE 6

| Type | Tool | Substrate Symbol | Hard Coating Layer (numeral in parentheses denotes target layer thickness: μm) | | | | | Deposited α-type Al$_2$O$_3$ Layer Inclination Angle Interval (degrees) | Frequency Ratio (%) |
|---|---|---|---|---|---|---|---|---|---|
| | | | First Layer | Second Layer | Third Layer | Fourth Layer | Fifth Layer | | |
| Conventional Coated Cermet Tool | 1 | A | TiN (1) | l-TiCN (17.5) | TiN (1) | TiCNO (0.5) | Deposited α-type Al$_2$O$_3$ (13) | Non existence | 11 |
| | 2 | B | TiCN (1) | l-TiCN (8.5) | TiCO (0.5) | Deposited α-type Al$_2$O$_3$ (5) | — | Non existence | 18 |
| | 3 | C | TiN (1) | l-TiCN (4) | TiC (4) | TiCNO (1) | Deposited α-type Al$_2$O$_3$ (15) | Non existence | 23 |
| | 4 | D | TiC (1) | l-TiCN (9) | Deposited α-type Al$_2$O$_3$ (1) | — | — | Non existence | 10 |

TABLE 6-continued

| | Tool | Hard Coating Layer (numeral in parentheses denotes target layer thickness: μm) | | | | | Deposited α-type Al₂O₃ Layer | |
|---|---|---|---|---|---|---|---|---|
| Type | Substrate Symbol | First Layer | Second Layer | Third Layer | Fourth Layer | Fifth Layer | Inclination Angle Interval (degrees) | Frequency Ratio (%) |
| 5 | E | TiN (1) | l-TiCN (4.5) | TiCO (0.5) | Deposited α-type Al₂O₃ (5) | — | Non existence | 17 |
| 6 | F | TiN (0.5) | l-TiCN (1.5) | TiC (0.5) | TiCNO (0.5) | Deposited α-type Al₂O₃ (3) | Non existence | 20 |
| 7 | A | TiN (1) | l-TiCN (8) | TiCNO (0.5) | Deposited α-type Al₂O₃ (8) | — | Non existence | 11 |
| 8 | a | TiN (1) | TiCN (19) | Deposited α-type Al₂O₃ (10) | — | — | Non existence | 15 |
| 9 | b | TiC (0.5) | l-TiCN (9) | TiCO (0.5) | Deposited α-type Al₂O₃ (4) | — | Non existence | 21 |
| 10 | c | TiN (1) | TiC (1) | TiCN (7) | TiCO (1) | Deposited α-type Al₂O₃ (15) | Non existence | 23 |
| 11 | d | TiN (1) | TiC (1) | l-TiCN (8) | Deposited α-type Al₂O₃ (7) | — | Non existence | 12 |
| 12 | e | TiC (1) | l-TiCN (4) | TiCNO (1) | Deposited α-type Al₂O₃ (12) | — | Non existence | 16 |
| 13 | f | TiCN (0.5) | TiC (2) | TiCNO (0.5) | Deposited α-type Al₂O₃ (1) | — | Non existence | 18 |

[In Table 6, Inclination Angle Interval represents an inclination angle interval in which the plane (0001) shows the highest peak; Frequency Ratio represents a frequency ratio in an inclination angle interval of 0 to 10 degrees]

TABLE 7

| | | Width of Flank Wear (mm) | | | | Cutting Test Result | | |
|---|---|---|---|---|---|---|---|---|
| Type | | Alloy Steel | Carbon Steel | Cast Iron | Type | Alloy Steel | Carbon Steel | Cast Iron |
| Coated Cermet Tool of Present Invention | 1 | 0.17 | 0.16 | 0.17 | Conventional Coated Cermet Tool | 1 Usable life of 1.6 minutes | Usable life of 1.5 minutes | Usable life of 1.8 minutes |
| | 2 | 0.13 | 0.11 | 0.14 | | 2 Usable life of 1.7 minutes | Usable life of 1.5 minutes | Usable life of 1.9 minutes |
| | 3 | 0.11 | 0.12 | 0.12 | | 3 Usable life of 1.5 minutes | Usable life of 1.4 minutes | Usable life of 1.6 minutes |
| | 4 | 0.21 | 0.18 | 0.20 | | 4 Usable life of 1.9 minutes | Usable life of 1.8 minutes | Usable life of 2.0 minutes |
| | 5 | 0.15 | 0.14 | 0.16 | | 5 Usable life of 2.1 minutes | Usable life of 2.2 minutes | Usable life of 1.9 minutes |
| | 6 | 0.17 | 0.16 | 0.18 | | 6 Usable life of 2.3 minutes | Usable life of 2.5 minutes | Usable life of 1.8 minutes |
| | 7 | 0.12 | 0.10 | 0.12 | | 7 Usable life of 1.8 minutes | Usable life of 1.7 minutes | Usable life of 1.8 minutes |
| | 8 | 0.11 | 0.11 | 0.13 | | 8 Usable life of 0.6 minutes | Usable life of 0.7 minutes | Usable life of 0.8 minutes |
| | 9 | 0.20 | 0.19 | 0.21 | | 9 Usable life of 1.3 minutes | Usable life of 1.4 minutes | Usable life of 1.3 minutes |
| | 10 | 0.17 | 0.16 | 0.18 | | 10 Usable life of 0.8 minutes | Usable life of 0.7 minutes | Usable life of 0.9 minutes |
| | 11 | 0.13 | 0.12 | 0.15 | | 11 Usable life of 1.1 minutes | Usable life of 1.0 minutes | Usable life of 1.2 minutes |
| | 12 | 0.19 | 0.17 | 0.20 | | 12 Usable life of 1.0 minutes | Usable life of 1.1 minutes | Usable life of 1.0 minutes |
| | 13 | 0.25 | 0.23 | 0.27 | | 13 Usable life of 1.4 minutes | Usable life of 1.3 minutes | Usable life of 1.1 minutes |

(In Table 7, usable life is caused from chipping generated on hard coating layer.)

As apparent from the results shown in Tables 5 to 7, in all the cermet tools 1 to 13 of the present invention in which the upper layers of the hard coating layers are composed of a heat-transformed α-type (Al, Zr)$_2$O$_3$ showing an inclination angle frequency-distribution graph on which the inclination angle of the plane (0001) shows the highest peak in an inclination angle interval in a range of 0 to 10 degrees and the ratio of the sum of frequencies in the inclination angle interval ranging from 0 to 10 degrees occupy 45% or more, the heat-transformed α-type (Al, Zr)$_2$O$_3$ layers exhibit excellent chipping resistance in high-speed intermittent cutting of steel or cast iron accompanied with very high mechanical and thermal impacts and high heat generation. As a result, occurrence of chipping in cutting edges is suppressed markedly and the excellent wear resistance is exhibited. To the contrary, in all the conventional coated cermet tools 1 to 13 in which the upper layers of the hard coating layers are composed of a deposited α-type Al$_2$O$_3$ layer showing an inclination angle frequency-distribution graph on which the distribution of measured inclination angles of the plane (0001) is unbiased in a range from 0 to 45 degrees, and the highest peak does not appear, the deposited α-type Al$_2$O$_3$ layers could not resist to severe mechanical and thermal impacts in high-speed intermittent cutting to generate chipping in the cutting edges, consequently shortening the usable life of the conventional cermet cutting tools.

EXAMPLE 2

The following powders, each having a mean particle size in a range of 1 to 3 μm, were prepared as raw materials for substrates: WC powder, TiC powder, ZrC powder, VC powder, TaC powder, NbC powder, Cr$_3$C$_2$ powder, TiN powder, TaN powder and Co powder. Those raw powders were compounded with each other based on the compounding compositions shown in Table 1, mixed with each other in an acetone solution having wax added thereto for 24 hours using a ball mill and were dried under reduced pressure. Thereafter, the resulting powder mixtures were press-formed into green compacts having predetermined shape at a pressure of 98 Mpa. The green compacts were then sintered in a vacuum under the following conditions: a pressure of 5 Pa, a predetermined temperature in a range of 1370 to 1470° C., and a holding duration of 1 hour. After sintering, cutting edges were subjected to horning (R: 0.07 mm) to manufacture tool substrates A to F made of WC-based cemented carbide and having throwaway tip shapes defined in ISO•CNMG120408.

Further, the following powders, each having a mean particle size in a range of 0.5 to 2 μm, were prepared as raw materials for substrates: TiCN (TiC/TiN=50/50 in weight ratio) powder, Mo$_2$C power, ZrC power, NbC powder, TaC powder, WC power, Co powder and Ni powder. Those raw powders were compounded with each other based on the compounding composition shown in Table 2, wet-mixed with each other for 24 hours using a ball mill and were dried. Thereafter, the resulting powder mixtures were press-formed into green compacts at a pressure of 98 MPa. The green compacts were then sintered in a nitrogen atmosphere under the following conditions: a pressure of 1.3 kPa, a temperature of 1540° C., and a holding duration of 1 hour. After sintering, cutting edges were subjected to horning (R: 0.07 mm) to manufacture tool substrates a to f made of TiCN-based cermet and having tip shapes defined in ISO Standard•CNMG120412.

Next, by using a general chemical vapor deposition reactor, on the surfaces of the tool substrates A to F and a to f, titanium compound layers as lower layers of the hard-coating layers were deposited with combinations and target layer thickness shown in Table 9 under conditions shown in Table 8 (in Table 8, l-TiCN represents formation conditions of TiCN layers having a lengthwise growth crystal structure described in Japanese Unexamined Patent Application Publication No. 6-8010, and the others represent formation conditions of general granular crystal structure). Next, similarly, (Al, Cr)$_2$O$_3$ layers having a κ-type or θ-type crystal structure were deposited with combinations and target layer thickness shown in Table 9 under conditions shown in Table 8. Subsequently, on the surfaces of the (Al, Cr)$_2$O$_3$ layers having a κ-type or θ-type crystal structure, a titanium oxide layer was deposited with combinations shown in Table 9 under conditions shown in Table 4. In this state, heat-transforming treatment was performed in an Ar atmosphere under the following conditions: a pressure of 30 kPa, a temperature of 1100° C., and a predetermined holding duration in a range of 20 to 100 minutes to transform the (Al, Cr)$_2$O$_3$ layers having a κ-type or θ-type crystal structure into (Al, Cr)$_2$O$_3$ layers having an α-type crystal structure. As a result, coated cermet tools 1 to 13 of the present invention having the heat-transformed α-type (Al, Cr)$_2$O$_3$ layers as upper layers of the hard-coating layers were manufactured, respectively.

Furthermore, in manufacturing the coated cermet tools 1 to 13 of the present invention, separate test pieces are prepared, and those test pieces were loaded into the same chemical vapor deposition reactor. The test pieces were taken out of the chemical vapor deposition reactor at the time when the titanium oxide layers are formed on the surfaces of the test pieces, and compositions (value Y) and layer thickness of the titanium oxide layers were measured (the longitudinal sections of the layers were measured) using Auger Electron Spectroscopy or a scanning electron microscope. As a result, all the coated cermet tools showed substantially the same compositions and average layer thickness (the average value of values measured at five points) as the target compositions and target layer thickness.

For the purpose of comparison, as shown in Table 10, the deposited α-type Al$_2$O$_3$ layers as upper layers of the hard-coating layers with target layer thickness shown in Table 10 were formed under the same conditions as those shown in Table 8. Then, conventional cermet tools 1 to 13 were manufactured under the same conditions as the above ones except that the formation of the titanium oxide layer and the heat-transforming treatment under the conditions mentioned above were not performed.

Next, an inclination angle frequency-distribution graph of the heat-transformed α-type (Al, Cr)$_2$O$_3$ layers and the deposited α-type Al$_2$O$_3$ layers that constitute the hard-coating layers of the coated cermet tools of the present invention and conventional cermet tools was drawn up using a field-emission-type scanning electron microscope.

Specifically, the inclination angle frequency-distribution graphs were drawn up through the following steps. First, the test pieces tools are set in a lens-barrel of a field-emission-type scanning electron microscope, using the surfaces of the heat-transformed α-type (Al, Cr)$_2$O$_3$ layers and deposited α-type Al$_2$O$_3$ layers thereof as surfaces to be polished. Then, electron beam having an acceleration voltage of 15 kV are individually radiated on crystal grains having the hexagonal crystal lattice in a measuring range of the polished surfaces with an irradiating current of 1 nA at an incidence angle of 70 degrees with respect to the polished surfaces. Next, an inclination angle of a normal line of the plane (0001) as a crystal plane in which each of the crystal grains is formed with respect to a normal line of each of the polished surface was measured at an interval of 0.1 μm/step for an area of 30×50 μm, using an electron backscattering diffraction image device. Based on these measurement results, among all the measured inclination angles, the measured inclination angles in a range of 0 to 45 degrees are sorted into several intervals at a pitch of 0.25 degrees, and the frequencies in each sorted interval are summed up.

In the resulting inclination angle frequency-distribution graphs of the various heat-transformed α-type (Al, Cr)$_2$O$_3$ layers and deposited α-type Al$_2$O$_3$ layers, an inclination angle interval in which the plane (0001) shows the highest peak, and the ratio occupied by the inclination angle frequencies in an inclination angle interval ranging from 0 to 10 degrees to all the inclination angle frequencies on the inclination angle frequency-distribution graph is shown in Tables 9 and 10, respectively.

In the above various inclination angle frequency-distribution graphs, as shown in Tables 9 and 10, respectively, all the heat-transformed α-type (Al, Cr)$_2$O$_3$ layers of the coated cermet tool of the present invention show an inclination angle frequency-distribution graph on which the measured inclination angle distribution of the plane (0001) shows the highest peak in the inclination angle interval in a range of 0 to 10 degrees and on which the ratio of the inclination angle frequencies in the inclination angle interval ranging from 0 to 10 degrees is 45% or more. To the contrary, all the deposited α-type Al$_2$O$_3$ layers of the conventional coated cermet tools 1 to 13 show an inclination angle frequency-distribution graph on which the distribution of measured inclination angles of the plane (0001) is unbiased in a range of 0 to 45 degrees, the highest peak does not appear, and the ratio of the inclination angle frequencies in the inclination angle interval ranging from 0 to 10 degrees is 25% or less.

Figure 3:
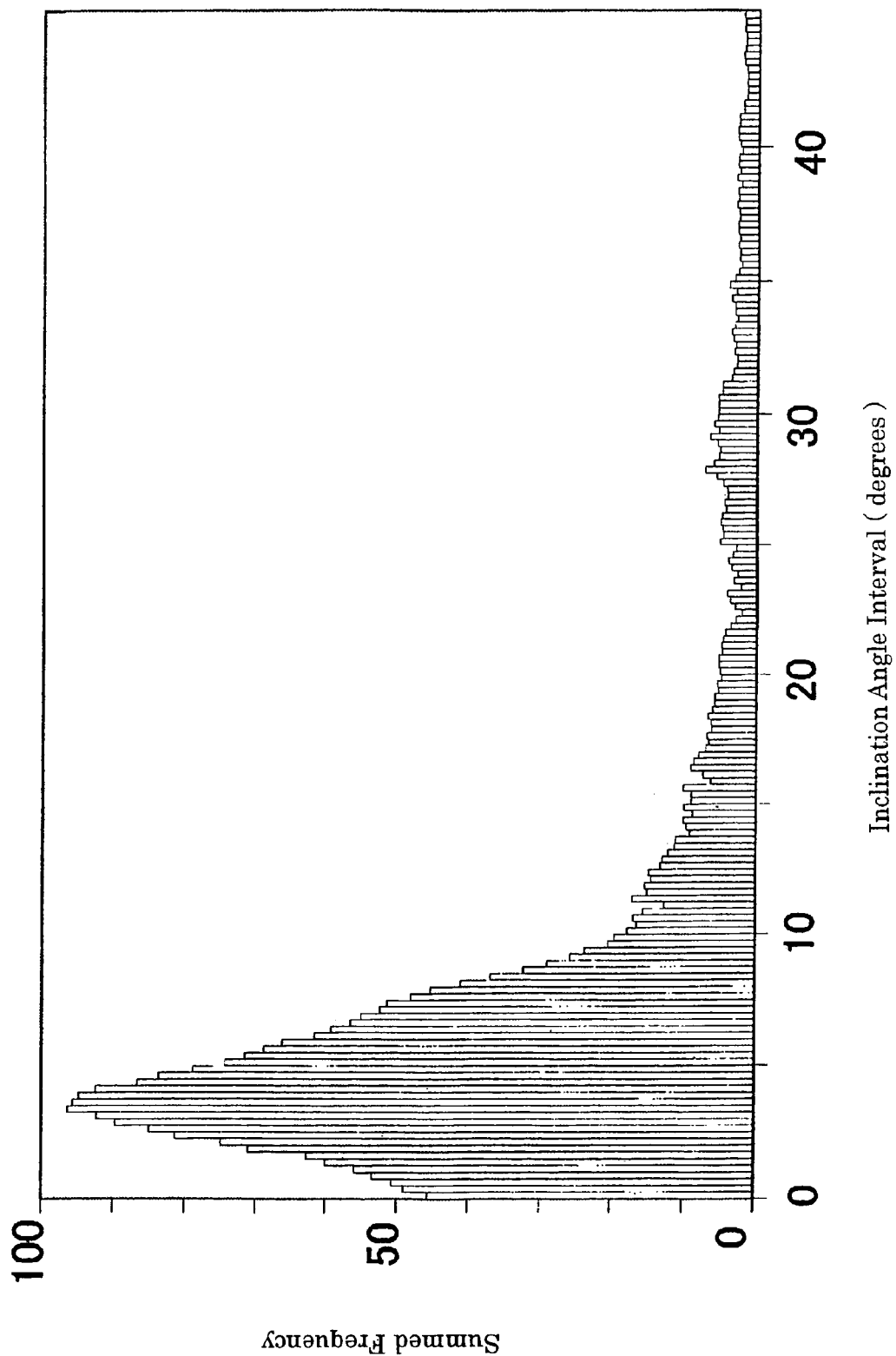
FIG. 3 is an inclination angle frequency-distribution graph of the plane (0001) of a heat-transformed α-type (Al, Cr)$_2$O$_3$ layer which constitutes a hard coating layer of a coated cermet tool 2 of the present invention as shown in Table 9.

In addition, FIG. 3 illustrates an inclination angle frequency-distribution graph of the heat-transformed α-type (Al, Cr)$_2$O$_3$ layer of the coated cermet tool 2 of the present invention, and FIG. 6 illustrates an angle frequency-distribution graph of the deposited α-type Al$_2$O$_3$ layer of the conventional coated cermet tool 10.

Moreover, as for the coated cermet tools 1 to 13 of the present invention and the conventional coated cermet tools 1 to 13, when the layers that constitute the hard coating layers of the coated cermet tools are observed using an electron probe micro-analyzer (EPMA) or the Auger electron Spectroscopy (when the longitudinal sections of the layers are observed), it was found that all the coated cermet tools 1 to 13 of the present invention are composed of a Ti compound layer and a heat-transformed α-type (Al, Cr)$_2$O$_3$ layer, which have substantially the same compositions as the target compositions, and the Ti compound layer deposited before heat-transforming treatment also exists in the surface of the tools. On the other hand, it was found that all the conventional cermet tools 1 to 13 are composed of a Ti compound layer and a deposited α-type Al$_2$O$_3$ layer, which have substantially the same compositions as the target compositions. Further, when the thickness of layers constituting the hard-coating layers of the coated cermet tools was measured by using a scanning electron microscope (similarly, the longitudinal sections of the layers were measured), all the coated cermet tools had substantially the same average layer thickness (the average value of values measured at five points) as the target layer thickness.

Next, in a state in which each of the above-mentioned various coated cermet tools was screw-fixed to a tip of a bite made of tool steel with a fixing jig, the coated cermet tools 1 to 13 of the present invention and the conventional coated cermet tools 1 to 13 were subjected to the following tests:

(1) a dry high-speed intermittent cutting test of alloyed steel (normal cutting speed is 200 m/min) under the following conditions:

Workpiece: a JIS•SCM 440 round bar having four longitudinal grooves equidistantly arranged in the longitudinal direction, Cutting speed: 350 m/min, Depth of cut: 1.5 mm, Feed rate: 0.2 mm/rev, Cutting time: 10 min, (2) a dry high-speed intermittent cutting test of carbon steel (normal cutting speed is 250 m/min) under the following conditions:

Workpiece: a JIS•S30C round bar having four longitudinal grooves equidistantly arranged in the longitudinal direction, Cutting speed: 450 m/min, Depth of cut: 2.0 mm, Feed rate: 0.3 mm/rev, Cutting time: 10 min, (3) a dry high-speed intermittent cutting test of cast iron (normal cutting speed is 250 m/min) under the following

TABLE 8

| Layer Constituting Hard Coating Layer | | Formation Condition (kPa denotes pressure of reaction atmosphere, and ° C. denotes temperature thereof) | | |
| --- | --- | --- | --- | --- |
| | | | Reaction Atmosphere | |
| Type | Target Composition (atomic ratio) | Reaction Gas Composition (volume %) | Pressure | Temperature |
| TiC | TiC | TiCl$_4$: 4.2%, CH$_4$: 8.5%, H$_2$: Balance | 7 | 1020 |

TABLE 8-continued

| Layer Constituting Hard Coating Layer | | Formation Condition (kPa denotes pressure of reaction atmosphere, and ° C. denotes temperature thereof) | | |
|---|---|---|---|---|
| Type | Target Composition (atomic ratio) | Reaction Gas Composition (volume %) | Reaction Atmosphere Pressure | Temperature |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiCC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| Deposited α-type $Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| Deposited κ-type MO: A | Cr (Value X): 0.005 | $AlCl_3$: 2.5%, $CrCl_3$: 0.05%, $CO_2$: 2.2%, HCl: 3%, $H_2S$: 0.1%, $H_2$: Balance | 1 | 950 |
| Deposited θ-type MO: B | Cr (Value X): 0.012 | $AlCl_3$: 2.5%, $CrCl_3$: 0.08%, $CO_2$: 2.2%, HCl: 3%, $H_2S$: 0.3%, $H_2$: Balance | 1 | 800 |
| Deposited κ-type MO: C | Cr (Value X): 0.02 | $AlCl_3$: 2.3% $CrCl_3$: 0.08%, $CO_2$: 2.2%, HCl: 3%, $H_2S$: 0.1%, $H_2$: Balance | 7 | 950 |
| Deposited θ-type MO: D | Cr (Value X): 0.025 | $AlCl_3$: 2.3%, $CrCl_3$: 0.1%, $CO_2$: 2.2%, HCl: 3%, $H_2S$: 0.3%, $H_2$: Balance | 7 | 800 |
| Deposited κ-type MO: E | Cr (Value X): 0.03 | $AlCl_3$: 2.2%, $CrCl_3$: 0.1%, $CO_2$: 2%, HCl: 3%, $H_2S$: 0.1%, $H_2$: Balance | 7 | 950 |
| Deposited θ-type MO: F | Cr (Value X): 0.035 | $AlCl_3$: 2.2%, $CrCl_3$: 0.12%, $CO_2$: 2%, HCl: 3%, $H_2S$: 0.3%, $H_2$: Balance | 7 | 800 |
| Deposited κ-type MO: G | Cr (Value X): 0.04 | $AlCl_3$: 2.2%, $CrCl_3$: 0.15%, $CO_2$: 2%, HCl: 3%, $H_2S$: 0.1%, $H_2$: Balance | 7 | 950 |

[In Table 8, MO denotes $(Al, Cr)_2O_3$]

TABLE 9

| Type | Tool Substrate Symbol | Hard Coating Layer (numeral in parentheses denotes target layer thickness: μm) | | | | | Ti Oxide Layer | | Heat-Transformed α-type MO Layer | |
|---|---|---|---|---|---|---|---|---|---|---|
| | | First Layer | Second Layer | Third Layer | Fourth Layer | Fifth Layer | Target Layer Symbol | Thickness (μm) | Inclination Angle Interval (degrees) | Frequency Ratio (%) |
| Coated Cermet Tool of Present Invention | 1 A | TiN (1) | l-TiCN (17.5) | TiN (1) | TiCNO (0.5) | Deposited θ-type MO: B (15) | III | 0.5 | 9.75–10.00 | 45 |
| | 2 B | TiCN (1) | l-TiCN (8.5) | TiCO (0.5) | Deposited κ-type MO: A (9) | — | IV | 1.5 | 3.25–3.50 | 77 |
| | 3 C | TiN (1) | l-TiCN (4) | TiC (4) | TiCNO (1) | Deposited κ-type MO: C (15) | V | 0.1 | 1.25–1.50 | 71 |
| | 4 D | TiC (1) | l-TiCN (9) | Deposited θ-type MO: D (3) | — | — | II | 0.8 | 0.00–0.25 | 69 |
| | 5 E | TiN (1) | l-TiCN (4.5) | TiCO | Deposited κ-type MO: E (5) | — | I | 1 | 4.25–4.50 | 89 |

TABLE 9-continued

| Type | Tool | | Hard Coating Layer (numeral in parentheses denotes target layer thickness: μm) | | | | | Ti Oxide Layer | | Heat-Transformed α-type MO Layer | |
|---|---|---|---|---|---|---|---|---|---|---|---|
| | Substrate Symbol | First Layer | Second Layer | Third Layer | Fourth Layer | Fifth Layer | Target Layer Symbol | Thickness (μm) | Inclination Angle Interval (degrees) | Frequency Ratio (%) |
| 6 | F | TiN (0.5) | l-TiCN (1.5) | TiC (0.5) | TiCNO (0.5) | Deposited κ-type MO: G (3) | III | 2 | 5.75-6.00 | 83 |
| 7 | A | TiN (1) | l-TiCN (8) | TiCNO (0.5) | Deposited κ-type MO: A (1) | — | VI | 0.2 | 6.50-6.75 | 85 |
| 8 | a | TiN (1) | TiCN (19) | Deposited κ-type MO: E (15) | — | — | IV | 1.2 | 8.25-8.50 | 50 |
| 9 | b | TiC (0.5) | l-TiCN (9) | TiCO (0.5) | Deposited κ-type MO: D (10) | — | V | 1 | 4.75-5.00 | 79 |
| 10 | c | TiN (1) | TiC (1) | TiCN (7) | TiCO (1) | Deposited θ-type MO: D (15) | III | 0.2 | 8.50-8.75 | 53 |
| 11 | d | TiN (1) | TiC (1) | l-TiCN (8) | Deposited κ-type MO: C (3) | — | VI | 1.8 | 7.00-7.25 | 59 |
| 12 | e | TiC (1) | l-TiCN (4) | TiCNO (1) | Deposited θ-type MO: F (5) | — | I | 1.5 | 5.00-5.25 | 80 |
| 13 | f | TiCN (0.5) | TiC (2) | TiCNO (0.5) | Deposited θ-type MO: B (3) | — | II | 0.4 | 3.00-3.25 | 73 |

[In Table 9, MO denotes (Al, Cr)$_2$O$_3$; Inclination Angle Interval represents an inclination angle interval in which the plane (0001) shows the highest peak; Frequency Ratio represents a frequency ratio in an inclination angle interval of 0 to 10 degrees]

TABLE 10

| Type | Tool | | Hard Coating Layer (numeral in parentheses denotes target layer thickness: μm) | | | | | Deposited α-type Al$_2$O$_3$ Layer | |
|---|---|---|---|---|---|---|---|---|---|
| | Substrate Symbol | First Layer | Second Layer | Third Layer | Fourth Layer | Fifth Layer | Inclination Angle Interval (degrees) | Frequency Ratio (%) |
| Conventional Coated Cermet Tool | 1 | A | TiN (1) | l-TiCN (17.5) | TiN (1) | TiCNO (0.5) | Deposited α-type Al$_2$O$_3$ (15) | Non existence | 13 |
| | 2 | B | TiCN (1) | l-TiCN (8.5) | TiCO (0.5) | Deposited α-type Al$_2$O$_3$ (9) | — | Non existence | 20 |
| | 3 | C | TiN (1) | l-TiCN (4) | TiC (4) | TiCNO (1) | Deposited α-type Al$_2$O$_3$ (15) | Non existence | 22 |
| | 4 | D | TiC (1) | l-TiCN (9) | Deposited α-type Al$_2$O$_3$ (3) | — | — | Non existence | 10 |
| | 5 | E | TiN (1) | l-TiCN (4.5) | TiCO (0.5) | Deposited α-type Al$_2$O$_3$ (5) | — | Non existence | 15 |
| | 6 | F | TiN (0.5) | l-TiCN (1.5) | TiC (0.5) | TiCNO (0.5) | Deposited α-type Al$_2$O$_3$ (3) | Non existence | 25 |
| | 7 | A | TiN (1) | l-TiCN (8) | TiCNO (0.5) | Deposited α-type Al$_2$O$_3$ (1) | — | Non existence | 10 |
| | 8 | a | TiN (1) | TiCN (19) | Deposited α-type Al$_2$O$_3$ (15) | — | — | Non existence | 21 |
| | 9 | b | TiC (0.5) | l-TiCN (9) | TiCO (0.5) | Deposited α-type Al$_2$O$_3$ (10) | — | Non existence | 17 |

TABLE 10-continued

| | Tool | | Hard Coating Layer (numeral in parentheses denotes target layer thickness: μm) | | | | | Deposited α-type Al$_2$O$_3$ Layer | |
|---|---|---|---|---|---|---|---|---|---|
| Type | Substrate Symbol | First Layer | Second Layer | Third Layer | Fourth Layer | Fifth Layer | | Inclination Angle Interval (degrees) | Frequency Ratio (%) |
| | 10 | c | TiN (1) | TiC (1) | TiCN (7) | TiCO (1) | Deposited α-type Al$_2$O$_3$ (15) | Non existence | 23 |
| | 11 | d | TiN (1) | TiC (1) | l-TiCN (8) | Deposited α-type Al$_2$O$_3$ (3) | — | Non existence | 16 |
| | 12 | e | TiC (1) | l-TiCN (4) | TiCNO (1) | Deposited α-type Al$_2$O$_3$ (5) | — | Non existence | 16 |
| | 13 | f | TiCN (0.5) | TiC (2) | TiCNO (0.5) | Deposited α-type Al$_2$O$_3$ (3) | — | Non existence | 22 |

[In Table 10, Inclination Angle Interval represents an inclination angle interval in which the plane (0001) shows the highest peak; Frequency Ratio represents a frequency ratio in an inclination angle interval of 0 to 10 degrees]

TABLE 11

| | | Width of Flank Wear (mm) | | | | | Cutting Test Result | | |
|---|---|---|---|---|---|---|---|---|---|
| Type | | Alloy Steel | Carbon Steel | Cast Iron | Type | | Alloy Steel | Carbon Steel | Cast Iron |
| Coated Cermet Tool of Present Invention | 1 | 0.40 | 0.47 | 0.48 | Conventional Coated Cermet Tool | 1 | Usable life of 3.2 minutes | Usable life of 3.5 minutes | Usable life of 3.9 minutes |
| | 2 | 0.18 | 0.20 | 0.22 | | 2 | Usable life of 5.3 minutes | Usable life of 6.0 minutes | Usable life of 6.5 minutes |
| | 3 | 0.21 | 0.23 | 0.24 | | 3 | Usable life of 4.9 minutes | Usable life of 5.7 minutes | Usable life of 6.1 minutes |
| | 4 | 0.26 | 0.28 | 0.30 | | 4 | Usable life of 4.7 minutes | Usable life of 5.2 minutes | Usable life of 5.8 minutes |
| | 5 | 0.20 | 0.22 | 0.23 | | 5 | Usable life of 5.0 minutes | Usable life of 5.8 minutes | Usable life of 6.3 minutes |
| | 6 | 0.32 | 0.34 | 0.36 | | 6 | Usable life of 4.5 minutes | Usable life of 5.0 minutes | Usable life of 5.4 minutes |
| | 7 | 0.35 | 0.41 | 0.43 | | 7 | Usable life of 3.8 minutes | Usable life of 4.0 minutes | Usable life of 4.2 minutes |
| | 8 | 0.28 | 0.30 | 0.33 | | 8 | Usable life of 4.6 minutes | Usable life of 5.0 minutes | Usable life of 5.6 minutes |
| | 9 | 0.22 | 0.24 | 0.25 | | 9 | Usable life of 4.8 minutes | Usable life of 5.5 minutes | Usable life of 6.0 minutes |
| | 10 | 0.39 | 0.45 | 0.46 | | 10 | Usable life of 3.2 minutes | Usable life of 3.8 minutes | Usable life of 4.0 minutes |
| | 11 | 0.35 | 0.40 | 0.42 | | 11 | Usable life of 4.0 minutes | Usable life of 4.5 minutes | Usable life of 4.8 minutes |
| | 12 | 0.24 | 0.25 | 0.27 | | 12 | Usable life of 4.7 minutes | Usable life of 5.3 minutes | Usable life of 6.0 minutes |
| | 13 | 0.34 | 0.37 | 0.39 | | 13 | Usable life of 4.4 minutes | Usable life of 4.7 minutes | Usable life of 5.0 minutes |

(In Table 11, usable life is caused from chipping generated on hard coating layer.)

As apparent from the results shown in Tables 9 to 11, in all the cermet tools 1 to 13 of the present invention in which the upper layers of the hard coating layers are composed of a heat-transformed α-type (Al, Cr)$_2$O$_3$ showing an inclination angle frequency-distribution graph on which the inclination angle of the plane (0001) shows the highest peak in an inclination angle interval in a range of 0 to 10 degrees and the ratio of the sum of frequencies in the inclination angle interval ranging from 0 to 10 degrees occupy 45% or more, the heat-transformed α-type (Al, Cr)$_2$O$_3$ layers exhibit excellent chipping resistance in high-speed intermittent cutting of steel or cast iron accompanied with very high mechanical and thermal impacts and high heat generation. As a result, occurrence of chipping in cutting edges is suppressed markedly and the excellent wear resistance is exhibited. To the contrary, in all the conventional coated cermet tools 1 to 13 in which the upper layers of the hard coating layers are composed of a deposited α-type Al$_2$O$_3$ layer showing an inclination angle frequency-distribution graph on which the distribution of measured inclination angles of the plane (0001) is unbiased in a range from 0 to 45 degrees, and the highest peak does not appear, the deposited α-type Al$_2$O$_3$ layers could not resist to severe mechanical and thermal impacts in high-speed intermittent cutting to generate chipping in the cutting edges, consequently shortening the usable life of the conventional cermet cutting tools.

EXAMPLE 3

The following powders, each having a mean particle size in a range of 1 to 3 μm, were prepared as raw materials for substrates: WC powder, TiC powder, ZrC powder, VC powder, TaC powder, NbC powder, Cr$_3$C$_2$ powder, TiN powder, TaN powder and Co powder. Those raw powders were compounded with each other based on the compounding compositions shown in Table 1, mixed with each other in an acetone solution having wax added thereto for 24 hours using a ball mill and were dried under reduced pressure. Thereafter, the resulting powder mixtures were press-formed into green compacts having predetermined shape at a pressure of 98 Mpa. The green compacts were then sintered in a vacuum under the following conditions: a pressure of 5 Pa, a predetermined temperature in a range of 1370 to 1470° C., and a holding duration of 1 hour. After sintering, cutting edges were subjected to horning (R: 0.07 mm) to manufacture tool substrates A to F made of WC-based cemented carbide and having throwaway tip shapes defined in ISO•CNMG120408.

Further, the following powders, each having a mean particle size in a range of 0.5 to 2 μm, were prepared as raw materials for substrates: TiCN (TiC/TiN=50/50 in weight ratio) powder, Mo$_2$C power, ZrC power, NbC powder, TaC powder, WC power, Co powder and Ni powder. Those raw powders were compounded with each other based on the compounding composition shown in Table 2, wet-mixed with each other for 24 hours using a ball mill and were dried. Thereafter, the resulting powder mixtures were press-formed into green compacts at a pressure of 98 MPa. The green compacts were then sintered in a nitrogen atmosphere under the following conditions: a pressure of 1.3 kPa, a temperature of 1540° C., and a holding duration of 1 hour. After sintering, cutting edges were subjected to horning (R: 0.07 mm) to manufacture tool substrates a to f made of TiCN-based cermet and having tip shapes defined in ISO•Standard CNMG120412.

Next, by using a general chemical vapor deposition reactor, on the surfaces of the tool substrates A to F and a to f, titanium compound layers as lower layers of the hard-coating layers were deposited with combinations and target layer thickness shown in Table 13 under conditions shown in Table 12 (in Table 12, l-TiCN represents formation conditions of TiCN layers having a lengthwise growth crystal structure described in Japanese Unexamined Patent Application Publication No. 6-8010, and the others represent formation conditions of general granular crystal structure). Next, similarly, (Al, Ti)$_2$O$_3$ layers having a κ-type or θ-type crystal structure were deposited with combinations and target layer thickness shown in Table 13 under conditions shown in Table 12. Subsequently, on the surfaces of the (Al, Ti)$_2$O$_3$ layers having a κ-type or θ-type crystal structure, a titanium oxide layer was deposited with combinations shown in Table 13 under conditions shown in Table 4. In this state, heat-transforming treatment was performed in an Ar atmosphere under the following conditions: a pressure of 30 kPa, a temperature of 1100° C., and a predetermined holding duration in a range of 20 to 100 minutes to transform the (Al, Ti)$_2$O$_3$ layers having a κ-type or θ-type crystal structure into (Al, Ti)$_2$O$_3$ layers having an α-type crystal structure. As a result, coated cermet tools 1 to 13 of the present invention having the heat-transformed α-type (Al, Ti)$_2$O$_3$ layers as upper layers of the hard-coating layers were manufactured, respectively.

Furthermore, in manufacturing the coated cermet tools 1 to 13 of the present invention, separate test pieces are prepared, and those test pieces were loaded into the same chemical vapor deposition reactor. The test pieces were taken out of the chemical vapor deposition reactor at the time when the titanium oxide layers are formed on the surfaces of the test pieces, and compositions (value Y) and layer thickness of the titanium oxide layers were measured (the longitudinal sections of the layers were measured) using Auger Electron Spectroscopy or a scanning electron microscope. As a result, all the coated cermet tools showed substantially the same compositions and average layer thickness (the average value of values measured at five points) as the target compositions and target layer thickness.

For the purpose of comparison, as shown in Table 14, the deposited α-type Al$_2$O$_3$ layers as upper layers of the hard-coating layers with target layer thickness shown in Table 14 were formed under the same conditions as those shown in Table 12. Then, conventional cermet tools 1 to 13 were manufactured under the same conditions as the above ones except that the formation of the titanium oxide layer and the heat-transforming treatment under the conditions mentioned above were not performed.

Next, an inclination angle frequency-distribution graph of the heat-transformed α-type (Al, Ti)$_2$O$_3$ layers and the deposited α-type Al$_2$O$_3$ layers that constitute the hard-coating layers of the coated cermet tools of the present invention and conventional cermet tools was drawn up using a field-emission-type scanning electron microscope.

Specifically, the inclination angle frequency-distribution graphs were drawn up through the following steps. First, the test pieces tools are set in a lens-barrel of a field-emission-type scanning electron microscope, using the surfaces of the heat-transformed α-type (Al, Ti)$_2$O$_3$ layers and deposited α-type Al$_2$O$_3$ layers thereof as surfaces to be polished. Then, electron beam having an acceleration voltage of 15 kV are individually radiated on crystal grains having the hexagonal crystal lattice in a measuring range of the polished surfaces with an irradiating current of 1 nA at an incidence angle of 70 degrees with respect to the polished surfaces. Next, an inclination angle of a normal line of the plane (0001) as a crystal plane in which each of the crystal grains is formed with respect to a normal line of each of the polished surface was measured at an interval of 0.1 μm/step for an area of 30×50 μm, using an electron backscattering diffraction image device. Based on these measurement results, among all the measured inclination angles, the measured inclination angles in a range of 0 to 45 degrees are sorted into several intervals at a pitch of 0.25 degrees, and the frequencies in each sorted interval are summed up.

In the resulting inclination angle frequency-distribution graphs of the various heat-transformed α-type (Al, Ti)$_2$O$_3$ layers and deposited α-type Al$_2$O$_3$ layers, an inclination angle interval in which the plane (0001) shows the highest peak, and the ratio occupied by the inclination angle frequencies in an inclination angle interval ranging from 0 to 10 degrees to all the inclination angle frequencies on the inclination angle frequency-distribution graph is shown in Tables 13 and 14, respectively.

In the above various inclination angle frequency-distribution graphs, as shown in Tables 13 and 14, respectively, all the heat-transformed α-type (Al, Ti)$_2$O$_3$ layers of the coated cermet tool of the present invention show an inclination angle frequency-distribution graph on which the measured inclination angle distribution of the plane (0001) shows the highest peak in the inclination angle interval in a range of 0 to 10 degrees and on which the ratio of the inclination angle frequencies in the inclination angle interval ranging from 0 to 10 degrees is 45% or more. To the contrary, all the deposited α-type Al$_2$O$_3$ layers of the conventional coated cermet tools 1 to 13 show an inclination angle frequency-distribution graph on which the distribution of measured inclination angles of the plane (0001) is unbiased in a range of 0 to 45 degrees, the highest peak does not appear, and the ratio of the inclination angle frequencies in the inclination angle interval ranging from 0 to 10 degrees is 25% or less.

Figure 4:
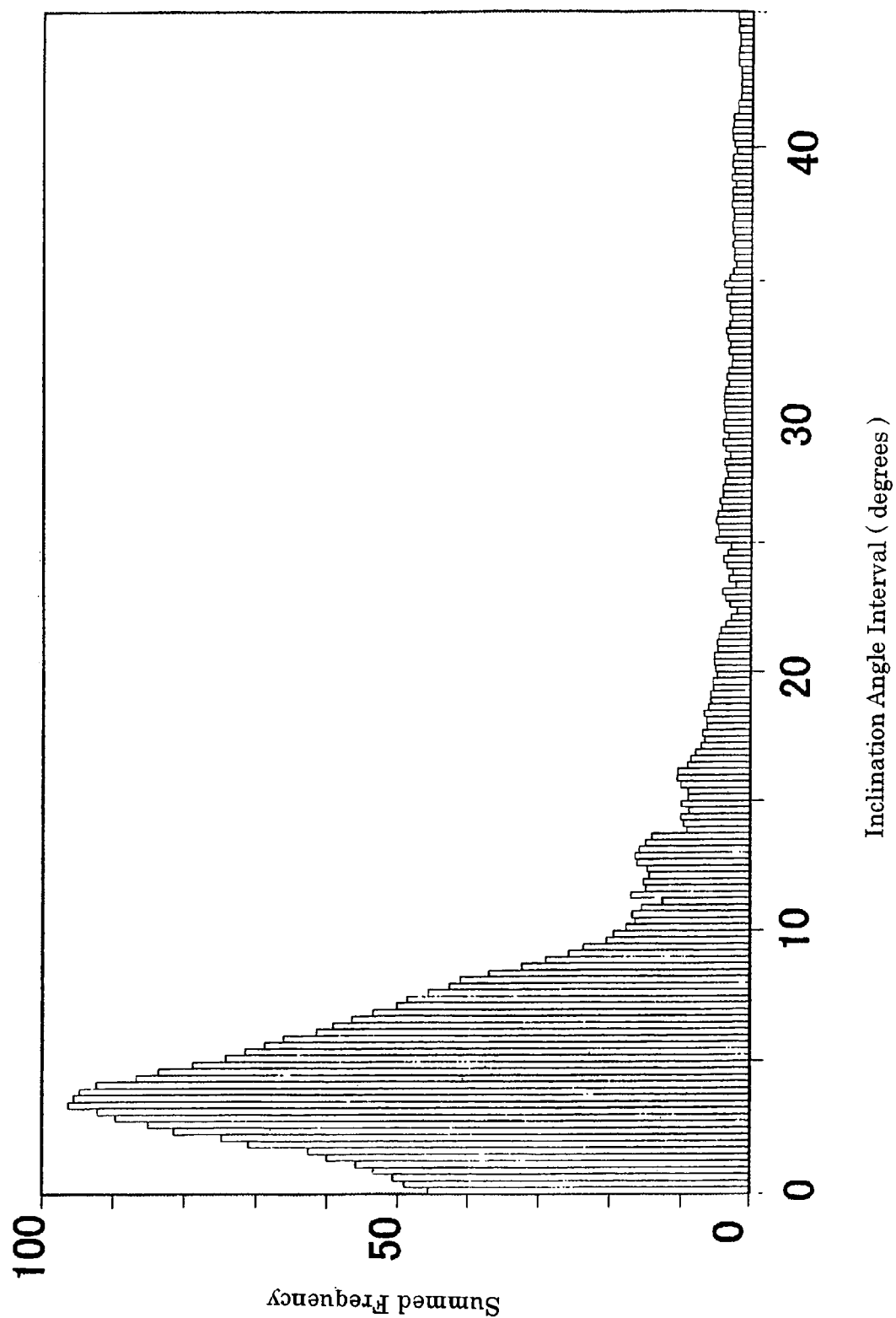
FIG. 4 is an inclination angle frequency-distribution graph of the plane (0001) of a heat-transformed α-type (Al, Ti)$_2$O$_3$ layer which constitutes a hard coating layer of a coated cermet tool 2 of the present invention as shown in Table 13.

In addition, FIG. 4 illustrates an inclination angle frequency-distribution graph of the heat-transformed α-type (Al, Ti)$_2$O$_3$ layer of the coated cermet tool 2 of the present invention, and FIG. 6 illustrates an angle frequency-distribution graph of the deposited α-type Al$_2$O$_3$ layer of the conventional coated cermet tool 10.

Moreover, as for the coated cermet tools 1 to 13 of the present invention and the conventional coated cermet tools 1 to 13, when the layers that constitute the hard coating layers of the coated cermet tools are measured using an electron probe micro-analyzer (EPMA) or the Auger Electron Spectroscopy (when the longitudinal sections of the layers are observed), it was found that all the coated cermet tools 1 to 13 of the present invention are composed of a Ti compound layer and a heat-transformed α-type (Al, Ti)$_2$O$_3$ layer, which have substantially the same compositions as the target compositions, and the Ti compound layer deposited before heat-transforming treatment also exists in the surfaces of the tools. On the other hand, it was found that all the conventional cermet tools 1 to 13 are composed of a Ti compound layer and a deposited α-type Al$_2$O$_3$ layer, which have substantially the same compositions as the target compositions. Further, when the thickness of layers constituting the hard-coating layers of the coated cermet tools was measured by using a scanning electron microscope (similarly, the longitudinal sections of the layers were measured), all the coated cermet tools had substantially the same average layer thickness (the average value of values measured at five points) as the target layer thickness.

Next, in a state in which each of the above-mentioned various coated cermet tools was screw-fixed to a tip of a bite made of tool steel with a fixing jig, the coated cermet tools 1 to 13 of the present invention and the conventional coated cermet tools 1 to 13 were subjected to the following tests:

(1) a dry high-speed intermittent cutting test of alloyed steel (normal cutting speed is 200 m/min) under the following conditions:

Workpiece: a JIS•SCM 415 round bar having four longitudinal grooves equidistantly arranged in the longitudinal direction, Cutting speed: 400 m/min, Depth of cut: 1.5 mm, Feed rate: 0.35 mm/rev, Cutting time: 5 min, (2) a dry high-speed intermittent cutting test of carbon steel (normal cutting speed is 250 m/min) under the following conditions:

Workpiece: a JIS•S35C round bar having four longitudinal grooves equidistantly arranged in the longitudinal direction, Cutting speed: 450 m/min, Depth of cut: 1.5 mm, Feed rate: 0.25 mm/rev, Cutting time: 5 min, (3) a dry high-speed intermittent cutting test of cast iron (normal cutting speed is 250 m/min) under the following conditions:

Workpiece: a JIS•FC150 round bar having four longitudinal grooves equidistantly arranged in the longitudinal direction, Cutting speed: 550 m/min, Depth of cut: 1.5 mm, Feed rate: 0.3 mm/rev, Cutting time: 5 min, Then, the width of flank wear of a cutting edge was measured in each test. The measurement results are shown in Table 15.

TABLE 12

| Layer Constituting Hard Coating Layer | | Formation Condition (kPa denotes pressure of reaction atmosphere, and ° C. denotes temperature thereof) | | |
|---|---|---|---|---|
| Type | Target Composition (atomic ratio) | Reaction Gas Composition (volume %) | Reaction Atmosphere | |
| | | | Pressure | Temperature |
| TiC | TiC | TiCl$_4$: 4.2%, CH$_4$: 8.5%, H$_2$: Balance | 7 | 1020 |
| TiN (First Layer) | TiN | TiCl$_4$: 4.2%, N$_2$: 30%, H$_2$: Balance | 30 | 900 |

TABLE 12-continued

| Layer Constituting Hard Coating Layer | | Formation Condition (kPa denotes pressure of reaction atmosphere, and ° C. denotes temperature thereof) | | |
|---|---|---|---|---|
| Type | Target Composition (atomic ratio) | Reaction Gas Composition (volume %) | Reaction Atmosphere Pressure | Temperature |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| Deposited α-type $Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| Deposited κ-type MO: A | Ti (Value X): 0.01 | $AlCl_3$: 3.27%, $TiCl_4$: 0.03%, $CO_2$: 5.5%, HCl: 2.2%, $H_2S$: 0.2%, $H_2$: Balance | 7 | 950 |
| Deposited θ-type MO: B | Ti (Value X): 0.015 | $AlCl_3$: 4.24%, $TiCl_4$: 0.07%, $CO_2$: 5.5%, HCl: 2.2%, $H_2S$: 0.2%, $H_2$: Balance | 7 | 800 |
| Deposited κ-type MO: C | Ti (Value X): 0.02 | $AlCl_3$: 3.23% $TiCl_4$: 0.07%, $CO_2$: 5.5%, HCl: 2.2%, $H_2S$: 0.2%, $H_2$: Balance | 7 | 950 |
| Deposited θ-type MO: D | Ti (Value X): 0.025 | $AlCl_3$: 4.19%, $TiCl_4$: 0.11%, $CO_2$: 5.5%, HCl: 2.2%, $H_2S$: 0.2%, $H_2$: Balance | 7 | 800 |
| Deposited κ-type MO: E | Ti (Value X): 0.03 | $AlCl_3$: 3.20%, $TiCl_4$: 0.10%, $CO_2$: 5.5%, HCl: 2.2%, $H_2S$: 0.2%, $H_2$: Balance | 7 | 950 |
| Deposited θ-type MO: F | Ti (Value X): 0.035 | $AlCl_3$: 4.15%, $TiCl_4$: 0.15%, $CO_2$: 5.5%, HCl: 2.2%, $H_2S$: 0.2%, $H_2$: Balance | 7 | 800 |
| Deposited κ-type MO: G | Ti (Value X): 0.04 | $AlCl_3$: 3.17%, $TiCl_4$: 0.13%, $CO_2$: 5.5%, HCl: 2.2%, $H_2S$: 0.2%, $H_2$: Balance | 7 | 950 |
| Deposited θ-type MO: H | Ti (Value X): 0.05 | $AlCl_3$: 4.09%, $TiCl_4$: 0.22%, $CO_2$: 5.5%, HCl: 2.2%, $H_2S$: 0.2%, $H_2$: Balance | 7 | 800 |

[In Table 12, MO denotes $(Al, Ti)_2O_3$]

TABLE 13

| Type | Tool | Substrate Symbol | Hard Coating Layer (numeral in parentheses denotes target layer thickness: μm) | | | | | Ti Oxide Layer Target Layer Symbol | Ti Oxide Layer Thickness (μm) | Heat-Transformed α-type MO Layer Inclination Angle Interval (degrees) | Heat-Transformed α-type MO Layer Frequency Ratio (%) |
|---|---|---|---|---|---|---|---|---|---|---|---|
| | | | First Layer | Second Layer | Third Layer | Fourth Layer | Fifth Layer | | | | |
| Coated Cermet Tool of Present Invention | 1 | A | TiN (1) | l-TiCN (17.5) | TiN (1) | TiCNO (0.5) | Deposited θ-type MO: B (15) | I | 0.25 | 8.50–8.75 | 55 |
| | 2 | B | TiCN (1) | l-TiCN (8.5) | TiCO (0.5) | Deposited κ-type MO: A (9) | — | IV | 0.5 | 3.25–3.50 | 77 |
| | 3 | C | TiN (1) | l-TiCN (4) | TiC (4) | TiCNO (1) | Deposited κ-type MO: C (15) | VI | 0.65 | 0.00–0.25 | 65 |
| | 4 | D | TiC (1) | l-TiCN (9) | Deposited θ-type MO: D (3) | — | — | II | 0.05 | 7.75–8.00 | 60 |
| | 5 | E | TiN (1) | l-TiCN (4.5) | TiCO (0.5) | Deposited κ-type MO: E (5) | — | I | 1.2 | 2.50–2.75 | 68 |
| | 6 | F | TiN (0.5) | l-TiCN (1.5) | TiC (0.5) | TiCNO (0.5) | Deposited κ-type MO: G (3) | III | 1.5 | 3.50–3.75 | 83 |

TABLE 13-continued

| | Tool | | Hard Coating Layer (numeral in parentheses denotes target layer thickness: μm) | | | | | Ti Oxide Layer | | Heat-Transformed α-type MO Layer | |
|---|---|---|---|---|---|---|---|---|---|---|---|
| Type | | Substrate Symbol | First Layer | Second Layer | Third Layer | Fourth Layer | Fifth Layer | Target Layer Symbol | Thickness (μm) | Inclination Angle Interval (degrees) | Frequency Ratio (%) |
| | 7 | A | TiN (1) | l-TiCN (8) | TiCNO (0.5) | Deposited κ-type MO: A (1) | — | II | 0.1 | 0.75-1.00 | 81 |
| | 8 | a | TiN (1) | TiCN (19) | Deposited κ-type MO: G (15) | — | — | IV | 0.9 | 4.00-4.25 | 88 |
| | 9 | b | TiC (0.5) | l-TiCN (9) | TiCO (0.5) | Deposited κ-type MO: H (10) | — | V | 0.75 | 9.75-10.00 | 45 |
| | 10 | c | TiN (1) | TiC (1) | TiCN (7) | TiCO (1) | Deposited θ-type MO: D (15) | III | 1.5 | 9.25-9.50 | 50 |
| | 11 | d | TiN (1) | TiC (1) | l-TiCN (8) | Deposited κ-type MO: C (3) | — | V | 1 | 6.25-6.50 | 72 |
| | 12 | e | TiC (1) | l-TiCN (4) | TiCNO (1) | Deposited θ-type MO: F (5) | — | III | 0.5 | 8.25-8.50 | 58 |
| | 13 | f | TiCN (0.5) | TiC (2) | TiCNO (0.5) | Deposited θ-type MO: B (3) | — | VI | 1.1 | 9.00-9.25 | 48 |

[In Table 13, MO denotes (Al, Ti)$_2$O$_3$; Inclination Angle Interval represents an inclination angle interval in which the plane (0001) shows the highest peak; Frequency Ratio represents a frequency ratio in an inclination angle interval of 0 to 10 degrees]

TABLE 14

| | Tool | | Hard Coating Layer (numeral in parentheses denotes target layer thickness: μm) | | | | | Deposited α-type Al$_2$O$_3$ Layer | |
|---|---|---|---|---|---|---|---|---|---|
| Type | | Substrate Symbol | First Layer | Second Layer | Third Layer | Fourth Layer | Fifth Layer | Inclination Angle Interval (degrees) | Frequency Ratio (%) |
| Conventional Coated Cermet Tool | 1 | A | TiN (1) | l-TiCN (17.5) | TiN (1) | TiCNO (0.5) | Deposited α-type Al$_2$O$_3$ (15) | Non existence | 12 |
| | 2 | B | TiCN (1) | l-TiCN (8.5) | TiCO (0.5) | Deposited α-type Al$_2$O$_3$ (9) | — | Non existence | 17 |
| | 3 | C | TiN (1) | l-TiCN (4) | TiC (4) | TiCNO (1) | Deposited α-type Al$_2$O$_3$ (15) | Non existence | 20 |
| | 4 | D | TiC (1) | l-TiCN (9) | Deposited α-type Al$_2$O$_3$ (3) | — | — | Non existence | 25 |
| | 5 | E | TiN (1) | l-TiCN (4.5) | TiCO (0.5) | Deposited α-type Al$_2$O$_3$ (5) | — | Non existence | 10 |
| | 6 | F | TiN (0.5) | l-TiCN (1.5) | TiC (0.5) | TiCNO (0.5) | Deposited α-type Al$_2$O$_3$ (3) | Non existence | 19 |
| | 7 | A | TiN (1) | l-TiCN (8) | TiCNO (0.5) | Deposited α-type Al$_2$O$_3$ (1) | — | Non existence | 13 |
| | 8 | a | TiN (1) | TiCN (19) | Deposited α-type Al$_2$O$_3$ (15) | — | — | Non existence | 22 |
| | 9 | b | TiC (0.5) | l-TiCN (9) | TiCO (0.5) | Deposited α-type Al$_2$O$_3$ (10) | — | Non existence | 15 |
| | 10 | c | TiN (1) | TiC (1) | TiCN (7) | TiCO (1) | Deposited α-type Al$_2$O$_3$ (15) | Non existence | 23 |

TABLE 14-continued

| | Tool | Hard Coating Layer (numeral in parentheses denotes target layer thickness: μm) | | | | | Deposited α-type Al₂O₃ Layer | |
|---|---|---|---|---|---|---|---|---|
| Type | Substrate Symbol | First Layer | Second Layer | Third Layer | Fourth Layer | Fifth Layer | Inclination Angle Interval (degrees) | Frequency Ratio (%) |
| | 11 d | TiN (1) | TiC (1) | l-TiCN (8) | Deposited α-type Al₂O₃ (3) | — | Non existence | 21 |
| | 12 e | TiC (1) | l-TiCN (4) | TiCNO (1) | Deposited α-type Al₂O₃ (5) | — | Non existence | 20 |
| | 13 f | TiCN (0.5) | TiC (2) | TiCNO (0.5) | Deposited α-type Al₂O₃ (3) | — | Non existence | 11 |

[In FIG. 14, Inclination Angle Interval represents an inclination angle interval in which the plane (0001) shows the highest peak; Frequency Ratio represents a frequency ratio in an inclination angle interval of 0 to 10 degrees]

TABLE 15

| | | Width of Flank Wear (mm) | | | | | Cutting Test Result | | |
|---|---|---|---|---|---|---|---|---|---|
| Type | | Alloy Steel | Carbon Steel | Cast Iron | Type | | Alloy Steel | Carbon Steel | Cast Iron |
| Coated Cermet Tool of Present Invention | 1 | 0.15 | 0.14 | 0.17 | Conventional Coated Cermet Tool | 1 | Usable life of 1.5 minutes | Usable life of 1.6 minutes | Usable life of 1.8 minutes |
| | 2 | 0.10 | 0.10 | 0.11 | | 2 | Usable life of 1.5 minutes | Usable life of 1.5 minutes | Usable life of 1.7 minutes |
| | 3 | 0.12 | 0.11 | 0.13 | | 3 | Usable life of 1.3 minutes | Usable life of 1.4 minutes | Usable life of 1.7 minutes |
| | 4 | 0.18 | 0.16 | 0.19 | | 4 | Usable life of 1.7 minutes | Usable life of 1.8 minutes | Usable life of 2.0 minutes |
| | 5 | 0.15 | 0.14 | 0.15 | | 5 | Usable life of 2.0 minutes | Usable life of 2.2 minutes | Usable life of 2.1 minutes |
| | 6 | 0.17 | 0.17 | 0.19 | | 6 | Usable life of 2.5 minutes | Usable life of 2.7 minutes | Usable life of 2.5 minutes |
| | 7 | 0.14 | 0.13 | 0.15 | | 7 | Usable life of 1.6 minutes | Usable life of 1.6 minutes | Usable life of 1.8 minutes |
| | 8 | 0.11 | 0.10 | 0.12 | | 8 | Usable life of 0.8 minutes | Usable life of 0.9 minutes | Usable life of 0.8 minutes |
| | 9 | 0.16 | 0.15 | 0.17 | | 9 | Usable life of 1.2 minutes | Usable life of 1.2 minutes | Usable life of 1.4 minutes |
| | 10 | 0.13 | 0.12 | 0.13 | | 10 | Usable life of 1.1 minutes | Usable life of 1.2 minutes | Usable life of 1.3 minutes |
| | 11 | 0.17 | 0.15 | 0.18 | | 11 | Usable life of 1.5 minutes | Usable life of 1.6 minutes | Usable life of 1.7 minutes |

TABLE 15-continued

| Type | Width of Flank Wear (mm) | | | Type | Cutting Test Result | | |
| --- | --- | --- | --- | --- | --- | --- | --- |
| | Alloy Steel | Carbon Steel | Cast Iron | | Alloy Steel | Carbon Steel | Cast Iron |
| 12 | 0.19 | 0.18 | 0.20 | 12 | Usable life of 1.6 minutes | Usable life of 1.7 minutes | Usable life of 1.9 minutes |
| 13 | 0.23 | 0.20 | 0.24 | 13 | Usable life of 1.8 minutes | Usable life of 1.9 minutes | Usable life of 2.1 minutes |

(In Table 15, usable life is caused from chipping generated on hard coating layer.)

As apparent from the results shown in Tables 13 to 15, in all the cermet tools 1 to 13 of the present invention in which the upper layers of the hard coating layers are composed of a heat-transformed α-type (Al, Ti)$_2$O$_3$ showing an inclination angle frequency-distribution graph on which the inclination angle of the plane (0001) shows the highest peak in an inclination angle interval in a range of 0 to 10 degrees and the ratio of the sum of frequencies in the inclination angle interval ranging from 0 to 10 degrees occupy 45% or more, the heat-transformed α-type (Al—Ti)$_2$O$_3$ layers exhibit excellent chipping resistance in high-speed intermittent cutting of steel or cast iron accompanied with very high mechanical and thermal impacts and high heat generation. As a result, occurrence of chipping in cutting edges is suppressed markedly and the excellent wear resistance is exhibited. To the contrary, in all the conventional coated cermet tools 1 to 13 in which the upper layers of the hard coating layers are composed of a deposited α-type Al$_2$O$_3$ layer showing an inclination angle frequency-distribution graph on which the distribution of measured inclination angles of the plane (0001) is unbiased in a range from 0 to 45 degrees, and the highest peak does not appear, the deposited α-type Al$_2$O$_3$ layers could not resist to severe mechanical and thermal impacts in high-speed intermittent cutting to generate chipping in the cutting edges, consequently shortening the usable life of the conventional cermet cutting tools.

EXAMPLE 4

The following powders, each having a mean particle size in a range of 1 to 3 μm, were prepared as raw materials for substrates: WC powder, TiC powder, ZrC powder, VC powder, TaC powder, NbC powder, Cr$_3$C$_2$ powder, TiN powder, TaN powder and Co powder. Those raw powders were compounded with each other based on the compounding compositions shown in Table 1, mixed with each other in an acetone solution having wax added thereto for 24 hours using a ball mill and were dried under reduced pressure. Thereafter, the resulting powder mixtures were press-formed into green compacts having predetermined shape at a pressure of 98 Mpa. The green compacts were then sintered in a vacuum under the following conditions: a pressure of 5 Pa, a predetermined temperature in a range of 1370 to 1470° C., and a holding duration of 1 hour. After sintering, cutting edges were subjected to horning (R: 0.07 mm) to manufacture tool substrates A to F made of WC-based cemented carbide and having throwaway tip shapes defined in ISO•CNMG120408.

Further, the following powders, each having a mean particle size in a range of 0.5 to 2 μm, were prepared as raw materials for substrates: TiCN (TiC/TiN=50/50 in weight ratio) powder, Mo$_2$C power, ZrC power, NbC powder, TaC powder, WC power, Co powder and Ni powder. Those raw powders were compounded with each other based on the compounding composition shown in Table 2, wet-mixed with each other for 24 hours using a ball mill and were dried. Thereafter, the resulting powder mixtures were press-formed into green compacts at a pressure of 98 MPa. The green compacts were then sintered in a nitrogen atmosphere under the following conditions: a pressure of 1.3 kPa, a temperature of 1540° C., and a holding duration of 1 hour. After sintering, cutting edges were subjected to horning (R: 0.07 mm) to manufacture tool substrates a to f made of TiCN-based cermet and having tip shapes defined in ISO Standard•CNMG120412.

Next, by using a general chemical vapor deposition reactor, on the surfaces of the tool substrates A to F and a to f, titanium compound layers as lower layers of the hard-coating layers were deposited with combinations and target layer thickness shown in Table 17 under conditions shown in Table 16 (in Table 16, l-TiCN represents formation conditions of TiCN layers having a lengthwise growth crystal structure described in Japanese Unexamined Patent Application Publication No. 6-8010, and the others represent formation conditions of general granular crystal structure). Next, similarly, the deposited κ, θ-Al$_2$O$_3$ layers were deposited with combinations and target layer thickness shown in Table 17 under conditions shown in Table 16. Subsequently, on the surfaces of the deposited κ, θ-Al$_2$O$_3$ layers, a titanium oxide thin layer was deposited with combinations shown in Table 17 under conditions shown in Table 4. Heat-transforming treatment was performed in an Ar atmosphere under the following conditions: a pressure of 30 kPa, a temperature of 1100° C., and a predetermined holding duration in a range of 10 to 60 minutes to transform the deposited κ, θ-Al$_2$O$_3$ layers into Al$_2$O$_3$ layers having an α-type crystal structure. As a result, coated cermet tools 1 to 13 of the present invention having the transformed α-Al$_2$O$_3$ layers as upper layers of the hard coating layers were manufactured, respectively.

Furthermore, in manufacturing the coated cermet tools 1 to 13 of the present invention, separate test pieces are prepared, and those test pieces were loaded into the same chemical vapor deposition reactor. The test pieces were taken out of the chemical vapor deposition reactor at the time when the thin titanium oxide thin layers are formed on the surfaces of the test pieces, and compositions (value X) and average layer thickness (μm) of the thin titanium oxide thin layer were measured (the longitudinal sections of the layers were measured) using Auger Electron Spectroscopy or a transmission electron microscope.

For the purpose of comparison, as shown in Table 18, the deposited α-type $Al_2O_3$ layers as upper layers of the hard-coating layers with target layer thickness shown in Table 18 were formed under the same conditions as those shown in Table 16. Then, conventional cermet tools 1 to 13 were manufactured under the same conditions as the above ones except that the formation of the titanium oxide thin layer and the heat-transforming treatment under the conditions mentioned above were not performed.

Next, an inclination angle frequency-distribution graph of the heat-transformed α-type $Al_2O_3$ layers and the deposited α-type $Al_2O_3$ layers that constitute the hard-coating layers of the coated cermet tools of the present invention and conventional cermet tools was drawn up using a field-emission-type scanning electron microscope.

Specifically, the inclination angle frequency-distribution graphs were drawn up through the following steps. First, the test pieces tools are set in a lens-barrel of a field-emission-type scanning electron microscope, using the surfaces of the transformed α-$Al_2O_3$ layers and deposited α-$Al_2O_3$ layers thereof as surfaces to be polished. Then, electron beam having an acceleration voltage of 15 kV are individually radiated on crystal grains having the hexagonal crystal lattice in a measuring range of the polished surfaces with an irradiating current of 1 nA at an incidence angle of 70 degrees with respect to the polished surfaces. Next, an inclination angle of a normal line of the plane (0001) as a crystal plane in which each of the crystal grains is formed with respect to a normal line of each of the polished surface was measured at an interval of 0.1 μm/step for an area of 30×50 μm, using an electron backscattering diffraction image device. Based on these measurement results, among all the measured inclination angles, the measured inclination angles in a range of 0 to 45 degrees are sorted into several intervals at a pitch of 0.25 degrees, and the frequencies in each sorted interval are summed up.

In the resulting inclination angle frequency-distribution graphs of the various heat-transformed α-$Al_2O_3$ layers and deposited α-$Al_2O_3$ layers, an inclination angle interval in which the plane (0001) shows the highest peak, and the ratio occupied by the inclination angle frequencies in an inclination angle interval ranging from 0 to 10 degrees to all the inclination angle frequencies on the inclination angle frequency-distribution graph is shown in Tables 17 and 18, respectively.

In the above various inclination angle frequency-distribution graphs, as shown in Tables 17 and 18, respectively, all the α-$Al_2O_3$ layers of the coated cermet tool of the present invention show an inclination angle frequency-distribution graph on which the measured inclination angle distribution of the plane (0001) shows the highest peak in the inclination angle interval in a range of 0 to 10 degrees and on which the ratio of the inclination angle frequencies in the inclination angle interval ranging from 0 to 10 degrees is 45% or more. To the contrary, all the deposited α-$Al_2O_3$ layers of the conventional coated cermet tools 1 to 13 show an inclination angle frequency-distribution graph on which the distribution of measured inclination angles of the plane (0001) is unbiased in a range of 0 to 45 degrees, the highest peak does not appear, and the ratio of the inclination angle frequencies in the inclination angle interval ranging from 0 to 10 degrees is 25% or less.

Figure 5:
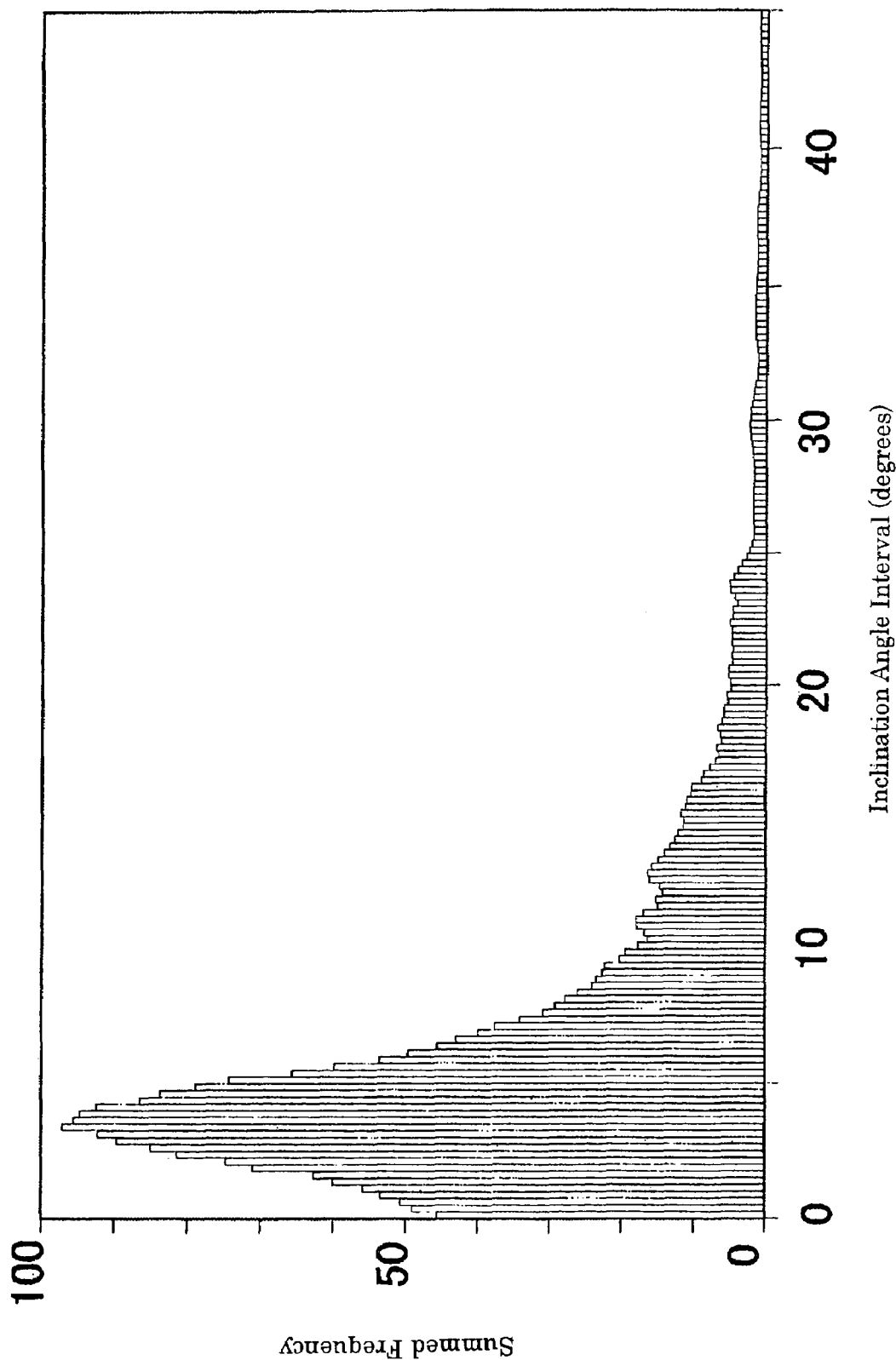
FIG. 5 is an inclination angle frequency-distribution graph of the plane (0001) of a transformed α-$Al_2O_3$ layer which constitutes a hard coating layer of a coated cermet tool 2 of the present invention as shown in Table 17.

In addition, FIG. 5 illustrates an inclination angle frequency-distribution graph of the transformed α-$Al_2O_3$ layer of the coated cermet tool 9 of the present invention, and FIG. 6 illustrates an angle frequency-distribution graph of the deposited α-$Al_2O_3$ layer of the conventional coated cermet tool 10.

Moreover, as for the resulting coated cermet tools 1 to 13 of the present invention and the resulting conventional coated cermet tools 1 to 13, when the layers that constitute the hard coating layers of the coated cermet tools are measured using the Auger Electron Spectroscopy (when the longitudinal sections of the layers are observed), it was found that all the coated cermet tools 1 to 13 of the present invention are composed of a Ti compound layer and a transformed α-$Al_2O_3$ layer, which have substantially the same compositions as the target compositions, and the Ti compound layer deposited in the surfaces of the tools before heat-transforming treatment also has the substantially the same compositions in the above measurement as the target compositions. On the other hand, it was found that all the conventional cermet tools 1 to 13 are composed of a Ti compound layer and a deposited α-type $Al_2O_3$ layer, which have substantially the same compositions as the target compositions. Moreover, when the thickness of layers constituting the hard coating layers of the coated cermet tools was measured by using a scanning electron microscope (similarly, the longitudinal sections of the layers were measured), all the coated cermet tools had substantially the same average layer thickness (the average value of values measured at five points) as the target layer thickness.

Next, in a state in which each of the above-mentioned various coated cermet tools was screw-fixed to a tip of a bite made of tool steel with a fixing jig, the coated cermet tools 1 to 13 of the present invention and the conventional coated cermet tools 1 to 13 were subjected to the following tests:

(1) a dry high-speed intermittent cutting test of alloyed steel (normal cutting speed is 200 m/min) under the following conditions:

Workpiece: a JIS•SCr 420H round bar having four longitudinal grooves equidistantly arranged in the longitudinal direction, Cutting speed: 380 m/min,
Depth of cut: 1.5 mm,
Feed rate: 0.2 mm/rev,
Cutting time: 10 min, (2) a dry high-speed intermittent cutting test of carbon steel (normal cutting speed is 200 m/min) under the following conditions:

Workpiece: a JIS•S40C round bar having four longitudinal grooves equidistantly arranged in the longitudinal direction,
Cutting speed: 350 m/min,
Depth of cut: 1.0 mm,
Feed rate: 0.25 mm/rev,
Cutting time: 10 min, (3) a dry high-speed intermittent cutting test of cast iron (normal cutting speed is 200 m/min) under the following conditions:

Workpiece: a JIS•FCD450 round bar having four longitudinal grooves equidistantly arranged in the longitudinal direction,
Cutting speed: 400 m/min,
Depth of cut: 1.5 mm,
Feed rate: 0.3 mm/rev,
Cutting time: 10 min, Then, the width of flank wear of a cutting edge was measured in each test. The measurement results are shown in Table 19.

TABLE 16

| Layer Constituting Hard Coating Layer | | Formation Condition (kPa denotes pressure of reaction atmosphere, and °C. denotes temperature thereof) | | |
|---|---|---|---|---|
| Type | Target Composition (atomic ratio) | Reaction Gas Composition (volume %) | Reaction Atmosphere Pressure | Temperature |
| TiC | TiC | $TiCl_4$: 4.2%, $CH_4$: 8.5%, $H_2$: Balance | 7 | 1020 |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| Deposited $\alpha$-$Al_2O_3$ | $\alpha$-$Al_2O_3$ | $AlCl_3$: 2.2%, $CO_2$: 5.5%, HCl: 2.2%, $H_2S$: 0.2%, $H_2$: Balance | 7 | 1000 |
| Deposited $\kappa$-$Al_2O_3$ | $\kappa$-$Al_2O_3$ | $AlCl_3$: 3.3%, $CO_2$: 5.5%, HCl: 2.2%, $H_2S$: 0.2%, $H_2$: Balance | 7 | 950 |
| Deposited $\theta$-$Al_2O_3$ | $\theta$-$Al_2O_3$ | $AlCl_3$: 4.3%, $CO_2$: 5.5%, HCl: 1.2%, $H_2S$: 0.2%, $H_2$: Balance | 7 | 800 |

TABLE 17

| Type | Tool Substrate Symbol | Hard Coating Layer (numeral in parentheses denotes target layer thickness: μm) | | | | | Thin Ti Oxide Layer | | Transformed $\alpha$-$Al_2O_3$ Layer | |
|---|---|---|---|---|---|---|---|---|---|---|
| | | First Layer | Second Layer | Third Layer | Fourth Layer | Fifth Layer | Symbol | Target Layer Thickness (μm) | Inclination Angle Interval (degrees) | Frequency Ratio (%) |
| Coated Cermet Tool of Present Invention | 1 A | TiN (1) | l-TiCN (17.5) | TiN (1) | TiCNO (0.5) | Deposited $\alpha$-$Al_2O_3$ (15) | III | 0.25 | 6.50-6.75 | 69 |
| | 2 B | TiCN (1) | l-TiCN (8.5) | TiCO (0.5) | Deposited $\kappa$-$Al_2O_3$ (9) | — | IV | 0.70 | 4.25-4.50 | 70 |
| | 3 C | TiN (1) | l-TiCN (4) | TiC (4) | TiCNO (1) | Deposited $\kappa$-$Al_2O_3$ (15) | I | 0.30 | 8.00-8.25 | 53 |
| | 4 D | TiC (1) | l-TiCN (9) | Deposited $\theta$-$Al_2O_3$ (3) | — | — | VI | 0.05 | 0.25-0.50 | 90 |
| | 5 E | TiN (1) | l-TiCN (4.5) | TiCO (0.5) | Deposited $\kappa$-$Al_2O_3$ (5) | — | II | 0.80 | 7.75-8.00 | 61 |

TABLE 17-continued

| Type | Tool Substrate Symbol | Hard Coating Layer (numeral in parentheses denotes target layer thickness: μm) | | | | | Thin Ti Oxide Layer Target Layer Symbol | Thickness (μm) | Transformed α-Al₂O₃ Layer Inclination Angle Interval (degrees) | Frequency Ratio (%) |
|---|---|---|---|---|---|---|---|---|---|---|
| | | First Layer | Second Layer | Third Layer | Fourth Layer | Fifth Layer | | | | |
| 6 | F | TiN (0.5) | l-TiCN (1.5) | TiC (0.5) | TiCNO (0.5) | Deposited κ-Al₂O₃ (3) | V | 0.65 | 3.00-3.25 | 79 |
| 7 | A | TiN (1) | l-TiCN (8) | TiCNO (0.5) | Deposited κ-Al₂O₃ (1) | — | II | 0.25 | 8.75-9.00 | 48 |
| 8 | a | TiN (1) | TiCN (19) | Deposited κ-Al₂O₃ (15) | — | — | IV | 0.55 | 5.50-5.75 | 68 |
| 9 | b | TiC (0.5) | l-TiCN (9) | TiCO (0.5) | Deposited κ-Al₂O₃ (10) | — | V | 0.40 | 3.25-3.50 | 77 |
| 10 | c | TiN (1) | TiC (1) | TiCN (7) | TiCO (1) | Deposited θ-Al₂O₃ (15) | II | 0.70 | 7.75-8.00 | 59 |
| 11 | d | TiN (1) | TiC (1) | l-TiCN (8) | Deposited κ-Al₂O₃ (3) | — | VI | 0.85 | 1.50-1.75 | 86 |
| 12 | e | TiC (1) | l-TiCN (4) | TiCNO (1) | Deposited κ-Al₂O₃ (5) | — | I | 0.15 | 9.75-10.00 | 45 |
| 13 | f | TiCN (0.5) | TiC (2) | TiCNO (0.5) | Deposited θ-Al₂O₃ (3) | — | III | 1.00 | 4.25-4.50 | 66 |

(In Table 17, Inclination Angle Interval represents an inclination angle interval in which the plane (0001) shows the highest peak; Frequency Ratio represents a frequency ratio in an inclination angle interval of 0 to 10 degrees)

TABLE 18

| Type | Tool Substrate Symbol | Hard Coating Layer (numeral in parentheses denotes target layer thickness: μm) | | | | | Deposited α-Al₂O₃ Layer Inclination Angle Interval (degrees) | Frequency Ratio (%) |
|---|---|---|---|---|---|---|---|---|
| | | First Layer | Second Layer | Third Layer | Fourth Layer | Fifth Layer | | |
| Conventional Coated Cermet Tool | 1 A | TiN (1) | l-TiCN (17.5) | TiN (1) | TiCNO (0.5) | Deposited α-Al₂O₃ (15) | Non existence | 5 |
| | 2 B | TiCN (1) | l-TiCN (8.5) | TiCO (0.5) | Deposited α-Al₂O₃ (9) | — | Non existence | 15 |
| | 3 C | TiN (1) | l-TiCN (4) | TiC (4) | TiCNO (1) | Deposited α-Al₂O₃ (15) | Non existence | 12 |
| | 4 D | TiC (1) | l-TiCN (9) | Deposited α-Al₂O₃ (3) | — | — | Non existence | 21 |
| | 5 E | TiN (1) | l-TiCN (4.5) | TiCO (0.5) | Deposited α-Al₂O₃ (5) | — | Non existence | 11 |
| | 6 F | TiN (0.5) | l-TiCN (1.5) | TiC (0.5) | TiCNO (0.5) | Deposited α-Al₂O₃ (3) | Non existence | 20 |
| | 7 A | TiN (1) | l-TiCN (8) | TiCNO (0.5) | Deposited α-Al₂O₃ (1) | — | Non existence | 3 |
| | 8 a | TiN (1) | TiCN (19) | Deposited α-Al₂O₃ (15) | — | — | Non existence | 6 |
| | 9 b | TiC (0.5) | l-TiCN (9) | TiCO (0.5) | Deposited α-Al₂O₃ (10) | — | Non existence | 8 |
| | 10 c | TiN (1) | TiC (1) | TiCN (7) | TiCO (1) | Deposited α-Al₂O₃ (15) | Non existence | 23 |

TABLE 18-continued

| | Tool | Hard Coating Layer (numeral in parentheses denotes target layer thickness: μm) | | | | | Deposited α-Al$_2$O$_3$ Layer | |
|---|---|---|---|---|---|---|---|---|
| | | | | | | | Inclination Angle | |
| Type | Substrate Symbol | First Layer | Second Layer | Third Layer | Fourth Layer | Fifth Layer | Interval (degrees) | Frequency Ratio (%) |
| 11 | d | TiN (1) | TiC (1) | l-TiCN (8) | Deposited α-Al$_2$O$_3$ (3) | — | Non existence | 19 |
| 12 | e | TiC (1) | l-TiCN (4) | TiCNO (1) | Deposited α-Al$_2$O$_3$ (5) | — | Non existence | 20 |
| 13 | f | TiCN (0.5) | TiC (2) | TiCNO (0.5) | Deposited α-Al$_2$O$_3$ (3) | — | Non existence | 25 |

[In Table 18, Inclination Angle Interval represents an inclination angle interval in which the plane (0001) shows the highest peak;
Frequency Ratio represents a frequency ratio in an inclination angle interval of 0 to 10 degrees]

TABLE 19

| | | Width of Flank Wear (mm) | | | | | Cutting Test Result | | |
|---|---|---|---|---|---|---|---|---|---|
| Type | | Alloy Steel | Carbon Steel | Cast Iron | Type | | Alloy Steel | Carbon Steel | Cast Iron |
| Coated Cermet Tool of Present Invention | 1 | 0.34 | 0.34 | 0.28 | Conventional Coated Cermet Tool | 1 | Usable life of 2.2 minutes | Usable life of 2.5 minutes | Usable life of 2.8 minutes |
| | 2 | 0.29 | 0.31 | 0.26 | | 2 | Usable life of 3.2 minutes | Usable life of 3.6 minutes | Usable life of 3.1 minutes |
| | 3 | 0.32 | 0.36 | 0.29 | | 3 | Usable life of 2.0 minutes | Usable life of 2.1 minutes | Usable life of 2.6 minutes |
| | 4 | 0.39 | 0.40 | 0.37 | | 4 | Usable life of 2.5 minutes | Usable life of 2.4 minutes | Usable life of 2.7 minutes |
| | 5 | 0.32 | 0.34 | 0.30 | | 5 | Usable life of 2.7 minutes | Usable life of 2.9 minutes | Usable life of 3.2 minutes |
| | 6 | 0.33 | 0.35 | 0.31 | | 6 | Usable life of 3.0 minutes | Usable life of 2.8 minutes | Usable life of 3.5 minutes |
| | 7 | 0.30 | 0.33 | 0.27 | | 7 | Usable life of 2.1 minutes | Usable life of 2.3 minutes | Usable life of 2.9 minutes |
| | 8 | 0.37 | 0.40 | 0.35 | | 8 | Usable life of 2.3 minutes | Usable life of 2.5 minutes | Usable life of 2.9 minutes |
| | 9 | 0.31 | 0.33 | 0.26 | | 9 | Usable life of 2.9 minutes | Usable life of 3.0 minutes | Usable life of 3.1 minutes |
| | 10 | 0.35 | 0.38 | 0.30 | | 10 | Usable life of 2.4 minutes | Usable life of 2.5 minutes | Usable life of 3.3 minutes |
| | 11 | 0.36 | 0.40 | 0.34 | | 11 | Usable life of 2.6 minutes | Usable life of 2.5 minutes | Usable life of 3.0 |

TABLE 19-continued

| | Width of Flank Wear (mm) | | | | Cutting Test Result | | |
|---|---|---|---|---|---|---|---|
| Type | Alloy Steel | Carbon Steel | Cast Iron | Type | Alloy Steel | Carbon Steel | Cast Iron |
| 12 | 0.34 | 0.36 | 0.29 | 12 | Usable life of 2.7 minutes | Usable life of 2.9 minutes | Usable life of 3.1 minutes |
| 13 | 0.36 | 0.36 | 0.30 | 13 | Usable life of 2.5 minutes | Usable life of 2.9 minutes | Usable life of 3.2 minutes |

(In Table 19, usable life is caused from chipping generated on hard coating layer.)

As apparent from the results shown in Tables 17 to 19, in all the cermet tools 1 to 13 of the present invention in which the upper layers of the hard coating layers are composed of a transformed α-Al$_2$O$_3$ showing an inclination angle frequency-distribution graph on which the inclination angle of the plane (0001) shows the highest peak in an inclination angle interval in a range of 0 to 10 degrees and the ratio of the sum of frequencies in the inclination angle interval ranging from 0 to 10 degrees occupy 45% or more, the transformed α-Al$_2$O$_3$ layers exhibit excellent chipping resistance in high-speed intermittent cutting of steel or cast iron accompanied with very high mechanical and thermal impacts and high heat generation. As a result, occurrence of chipping in cutting edges is suppressed markedly and the excellent wear resistance is exhibited. To the contrary, in all the conventional coated cermet tools 1 to 13 in which the upper layers of the hard coating layers are composed of a deposited α-Al$_2$O$_3$ layer showing an inclination angle frequency-distribution graph on which the distribution of measured inclination angles of the plane (0001) is unbiased in a range from 0 to 45 degrees, and the highest peak does not appear, the deposited α-Al$_2$O$_3$ layers could not resist to severe mechanical and thermal impacts in high-speed intermittent cutting to generate chipping in the cutting edges, consequently shortening the usable life of the conventional cermet cutting tools.

As described above, the coated cermet tools of the present invention exhibit excellent chipping resistance not only in continuous cutting or intermittent cutting of various materials such as steel and cast iron under normal conditions but also in high-speed intermittent cutting work having severe cutting conditions, and exhibit excellent cutting performance for a prolonged period of time. Accordingly, it is possible to sufficiently and satisfactorily cope with the demand for high performance of a cutting device, labor saving and energy saving in cutting work, and cost reduction.

Further, the coated cermet tools of the present invention exhibit excellent chipping resistance not only in continuous cutting or intermittent cutting of various materials such as steel and cast iron under normal conditions but also in high-speed intermittent cutting under the severest cutting condition accompanied with very high mechanical and thermal impacts and high heat generation, and exhibit excellent cutting performance for a prolonged period of time. Accordingly, it is possible to sufficiently and satisfactorily cope with the demand for high performance of a cutting device, labor saving and energy saving in cutting work, and cost reduction.

What is claimed is:

1. A surface-coated cermet cutting tool comprising:
   a hard-coating layer having a resistance to chipping,
   wherein the surface-coated cermet cutting tool is formed by coating, on a surface of a tool substrate made of tungsten carbide based cemented carbide or titanium carbonitride based cermet, the hard-coating layer comprising:
   (a) a lower layer comprising a titanium compound layer with at least one or two of a titanium carbide layer, a titanium nitride layer, a titanium carbonitride layer, a titanium carboxide layer and a titanium oxycarbonitride layer, the titanium compound layer having a total average layer thickness of 3 to 20 μm, and
   (b) an upper layer comprising a heat-transformed α-type Al—Zr oxide layer formed by carrying out a heat-transforming treatment in a state that a titanium oxide layer satisfying the composition formula: TiO$_y$, (where value Y is 1.2 to 1.9 in an atomic ratio to Ti when measured by Auger Electron Spectroscopy) and having an average layer thickness of 0.05 to 1.5 μm is chemically deposited on a surface of an Al—Zr oxide layer having a κ-type or θ-type crystal structure and satisfying the composition formula: (Al$_{1-x}$Zr$_x$)$_2$O$_3$, where value X is 0.003 to 0.05 in an atomic ratio when measured by an electron probe micro-analyzer (EPMA), to transform the crystal structure of the Al—Zr oxide layer having the κ-type or θ-type crystal structure into an α-type crystal structure,
   wherein the heat-transformed α-type Al—Zr oxide layer is characterized by having a highest peak at an inclination angle interval in a range of 0 to 10 degrees in an inclination angle frequency-distribution graph, and a sum of frequencies in a range of 0 to 10 degrees occupies 45% or more of the total sum of frequencies in the inclination angle frequency-distribution graph, and the inclination angle frequency-distribution graph is obtained from results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and wherein the heat-transformed α-type Al—Zr oxide layer has an average layer thickness of 1 to 15 μm.

2. A surface-coated cermet cutting tool comprising:

a hard-coating layer having a resistance to chipping, wherein the surface-coated cermet cutting tool is formed by coating, on a surface of a tool substrate made of tungsten carbide based cemented carbide or titanium carbonitride based cermet, the hard-coating layer comprising:

(a) a lower layer comprising a titanium compound layer with at least one or two of a titanium carbide layer, a titanium nitride layer, a titanium carbonitride layer, a titanium carboxide layer and a titanium oxycarbonitride layer, and the titanium compound layer having a total average layer thickness of 3 to 20 μm, and (b) an upper layer comprising a heat-transformed α-type Al—Cr oxide layer formed by carrying out a heat-transforming treatment in a state that a titanium oxide layer satisfying the composition formula: $TiO_y$, (where value Y is 1.2 to 1.9 in an atomic ratio to Ti when measured by Auger Electron Spectroscopy) and having an average layer thickness of 0.1 to 2 aim is chemically deposited on a surface of an Al—Cr oxide layer having a κ-type or θ-type crystal structure and satisfying the composition formula: $(Al_{1-x}Cr_X)_2O_3$, where value X is 0.005 to 0.04 in an atomic ratio when measured by an electron probe micro-analyzer (EPMA), to transform the crystal structure of the Al—Cr oxide layer having the κ-type or θ-type crystal structure into an α-type crystal structure, wherein the heat-transformed α-type Al—Cr oxide layer is characterized by having a highest peak at an inclination angle interval in a range of 0 to 10 degrees in an inclination angle frequency-distribution graph, and a sum of frequencies in a range of 0 to 10 degrees occupies 45% or more of the total sum of frequencies in the inclination angle frequency-distribution graph, and the inclination angle frequency-distribution graph is obtained from the results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and wherein the heat-transformed α-type Al—Cr oxide layer has an average layer thickness of 1 to 15 μm.

3. A surface-coated cermet cutting tool comprising:

a hard-coating layer having a resistance to chipping, wherein the surface-coated cermet cutting tool is formed by coating, on a surface of a tool substrate made of tungsten carbide based cemented carbide or titanium carbonitride based cermet, the hard-coating layer comprising:

(a) a lower layer comprising a titanium compound layer with at least one or two of a titanium carbide layer, a titanium nitride layer, a titanium carbonitride layer, a titanium carboxide layer and a titanium oxycarbonitride layer, and the titanium compound layer having a total average layer thickness of 3 to 20 μm, and (b) an upper layer comprising a heat-transformed α-type Al—Ti oxide layer formed by carrying out a heat-transforming treatment in a state that a titanium oxide layer satisfying the composition formula: $TiO_y$, (where value Y is 1.2 to 1.9 in an atomic ratio to Ti when measured by Auger Electron Spectroscopy) and having an average layer thickness of 0.05 to 1.5 μm is chemically deposited on a surface of an Al—Ti oxide layer having a κ-type or θ-type crystal structure and satisfying the composition formula: $(Al_{1-x}Ti_X)_2O_3$ where value X is 0.01 to 0.05 in an atomic ratio when measured by an electron probe micro-analyzer (EPMA), to transform the crystal structure of the Al—Ti oxide layer having the κ-type or θ-type crystal structure into an α-type crystal structure, wherein the heat-transformed α-type Al—Ti oxide layer is characterized by having a highest peak at an inclination angle interval in a range of 0 to 10 degrees in an inclination angle frequency-distribution graph, and a sum of frequencies in a range of 0 to 10 degrees occupies 45% or more of the total sum of frequencies on the inclination angle frequency-distribution graph, and the inclination angle frequency-distribution graph is obtained from the results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and wherein the heat-transformed α-type Al—Ti oxide layer has an average layer thickness of 1 to 15 μm.

4. A surface-coated cermet cutting tool comprising:

a hard-coating layer having a resistance to chipping, wherein the surface-coated cermet cutting tool is formed by coating, on a surface of a tool substrate made of tungsten carbide based cemented carbide or titanium carbonitride based cermet, the hard-coating layer comprising:

(a) a lower layer comprising a titanium compound layer comprising at least one or two of a titanium carbide layer, a titanium nitride layer, a titanium carbonitride layer, a titanium carboxide layer and a titanium oxycarbonitride layer, the titanium compound layer having a total average layer thickness of 3 to 20 μm, and (b) an upper layer comprising a heat-transformed α-type aluminum oxide layer formed by carrying out a heat-transforming treatment in a state that a titanium oxide thin layer satisfying the composition formula: $TiO_X$, (where value X is 1.2 to 1.9 in an atomic ratio to Ti when measured by Auger Electron Spectroscopy) and having an average layer thickness of 0.05 to 1.0 μm is chemically deposited on a surface of a deposited aluminum oxide layer having a κ-type or θ-type crystal structure to transform the crystal structure of the aluminum oxide layer having the κ-type or θ-type crystal structure into an α-type crystal structure, wherein the heat-transformed α-type aluminum oxide layer is characterized by having a highest peak at an inclination angle interval in a range of 0 to 10 degrees in an inclination angle frequency-distribution graph, and a sum of frequencies in a range of 0 to 10 degrees occupies 45% or more of the total sum of frequencies on the inclination angle frequency-distribution graph, and the inclination angle frequency-distribution graph is obtained from results of radiating electron beam onto crystal grains having a hexagonal crystal lattice in a measuring range of surfaces to be polished using a field-emission-type scanning electron microscope, measuring an inclination angle of a normal line of the plane (0001) as a crystal plane in which each of the crystal grains is formed with respect to each of the polished surfaces, sorting the measured inclination angles in a range of 0 to 45 degrees among all the measured inclination angles into several intervals at a pitch of 0.25 degrees, and summing up the frequencies in each of the intervals, and wherein the heat-transformed α-type aluminum oxide layer has an average layer thickness of 1 to 15 μm.

* * * * *

UNITED STATES PATENT AND TRADEMARK OFFICE
CERTIFICATE OF CORRECTION

PATENT NO.       : 7,276,301 B2                                      Page 1 of 1
APPLICATION NO.  : 10/999222
DATED            : October 2, 2007
INVENTOR(S)      : Fumio Tsushima et al.

It is certified that error appears in the above-identified patent and that said Letters Patent is hereby corrected as shown below:

Title Page, item [30] Foreign Priority Data

Please delete "June 10, 2004 (JP) 2003-172510" and
insert -- June 10, 2004 (JP) 2004-172510--

Signed and Sealed this

Fourth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,276,301 B2  Page 1 of 1
APPLICATION NO. : 10/999222
DATED : October 2, 2007
INVENTOR(S) : Fumio Tsushima et al.

It is certified that error appears in the above-identified patent and that said Letters Patent is hereby corrected as shown below:

Title page, item [30]
For Foreign Priority Data

Please delete "June 10, 2004 (JP) 2003-172510" and insert
--June 10, 2004 (JP) 2004-172510--

Signed and Sealed this

Twenty-fifth Day of December, 2007

JON W. DUDAS
*Director of the United States Patent and Trademark Office*